United States Patent
Mueller et al.

(10) Patent No.: US 11,189,585 B2
(45) Date of Patent: Nov. 30, 2021

(54) SELECTIVE RECESS OF INTERCONNECTS FOR PROBING HYBRID BOND DEVICES

(71) Applicant: Intel Corporation, Santa Clara, CA (US)

(72) Inventors: Brennen K. Mueller, Portland, OR (US); Adel Elsherbini, Tempe, AZ (US); Mauro Kobrinsky, Portland, OR (US); Johanna Swan, Scottsdale, AZ (US); Shawna Liff, Scottsdale, AZ (US); Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 16/703,298

(22) Filed: Dec. 4, 2019

(65) Prior Publication Data
US 2021/0175192 A1 Jun. 10, 2021

(51) Int. Cl.
*H01L 23/52* (2006.01)
*H01L 23/00* (2006.01)

(52) U.S. Cl.
CPC .............. *H01L 24/08* (2013.01); *H01L 24/03* (2013.01); *H01L 24/89* (2013.01); *H01L 2224/03831* (2013.01); *H01L 2224/08121* (2013.01); *H01L 2224/08147* (2013.01); *H01L 2224/80895* (2013.01); *H01L 2224/80896* (2013.01)

(58) Field of Classification Search
CPC ......... H01L 24/08; H01L 24/03; H01L 24/89; H01L 2224/03831; H01L 2224/08147; H01L 2224/80895; H01L 2224/80896

USPC .......................................................... 257/777
See application file for complete search history.

(56) References Cited

U.S. PATENT DOCUMENTS

| | | | |
|---|---|---|---|
| 9,318,471 B2 * | 4/2016 | Kabe .................... | H01L 23/5227 |
| 10,141,392 B2 * | 11/2018 | Yang ....................... | H01L 28/40 |
| 10,811,388 B2 * | 10/2020 | Haba .................. | H01L 21/02164 |
| 2014/0015088 A1 | 1/2014 | Chapelon | |
| 2019/0181107 A1 | 6/2019 | Delacruz et al. | |
| 2020/0035643 A1 | 1/2020 | Hirata et al. | |

FOREIGN PATENT DOCUMENTS

JP    2018073851    5/2018

OTHER PUBLICATIONS

Extended European Search Report for European Patent Application No. 20197571.1, dated Mar. 23, 2021.

* cited by examiner

*Primary Examiner* — Luan C Thai
(74) *Attorney, Agent, or Firm* — Essential Patents Group, LLP.

(57) ABSTRACT

An Integrated Circuit (IC) device comprising a first component, the first component comprising a first dielectric and a plurality of adjacent first interconnect structures within the first dielectric. The IC device comprising a second component, the second component comprising a second dielectric and a plurality of adjacent second interconnect structures within the second dielectric. A first of the second interconnect structures is in direct contact with a first of the first interconnect structures at a bond interface between the first and second components. A second of the first interconnect structures is set back a distance from a plane of the bond interface.

17 Claims, 16 Drawing Sheets

SELECTIVE RECESS OF INTERCONNECTS FOR PROBING HYBRID BOND DEVICES

BACKGROUND

Vertical integration, where two or more IC dies are stacked and bonded together (according to multi-chip packaging, wafer stacking, or die stacking techniques) currently employ on solder bonding to interconnect IC dies. Currently, the type of IC device (e.g., CPUs, GPUs, FPGAs, RFICs, etc.) drives the choice of interconnect layer thicknesses and dimensional design rules within back end of line (BEOL) metallization stack of the integrated circuit. As feature pitches approach 10 microns or less, solder bonding is being replaced by hybrid bonding techniques, where metallization features on the stacked dies are directly bonded without solder. Hybrid bonding requires very low surface topography of both top level interconnect features and dielectric. Standard known good die testing methods are incompatible with hybrid bonding due to surface damage of test pads caused by testing probes. Topography of the test pad structures may be increased beyond limits required by hybrid bonding.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only. Views labeled "cross-sectional", "profile", "plan", and "isometric" correspond to orthogonal planes within a Cartesian coordinate system. Thus, cross-sectional and profile views are taken in the x-z plane, plan views are taken in the x-y plane, and isometric views are taken in a 3-dimensional Cartesian coordinate system (x-y-z). Where appropriate, drawings are labeled with axes to indicate the orientation of the figure.

DETAILED DESCRIPTION

Figure 1A:
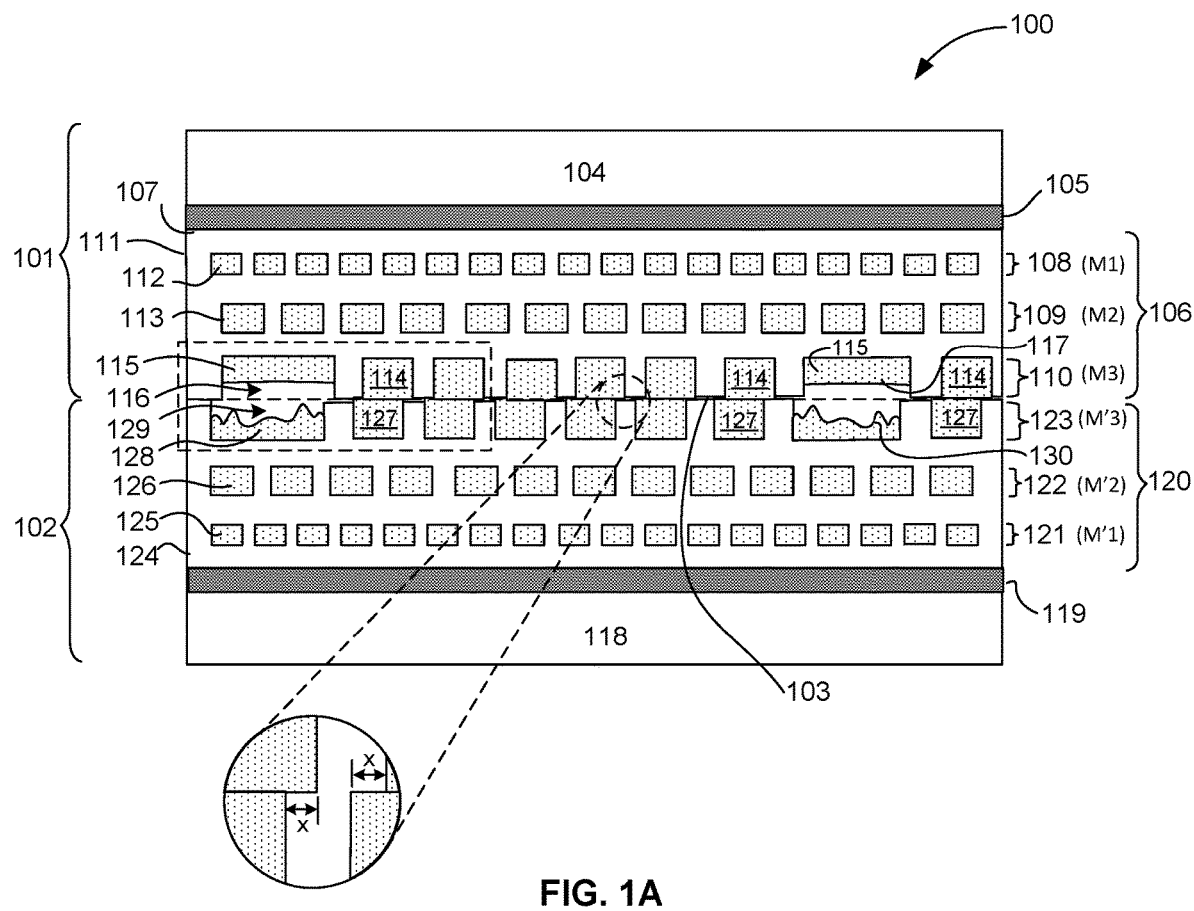
FIG. 1A illustrates a cross sectional view in the x-z plane of an exemplary composite die structure, according to some embodiments of the disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to a printed circuit board (PCB).

Here, the term "back end of the line (BEOL) generally refers to post-device fabrication operations on a semiconductor wafer. After formation of the active and passive devices within a circuit layer on the semiconductor wafer in a front-end of the fabrication line (e.g., front-end-of-the line or FEOL), a series of operations where metal features are formed (metallization) over the semiconductor devices comprise the BEOL portion of the fabrication line.

The meaning of "a," "an," and "the" include plural references. The meaning of "in" includes "in" and "on." The vertical orientation is in the z-direction and it is understood that recitations of "top", "bottom", "above" "over" and "below" refer to relative positions in the z-dimension with the usual meaning. Generally, "top", "above", and "over" refer to a superior position on the z-dimension, whereas "bottom", "below" and "under" refer to an inferior position on the z-dimension. The term "on" is used in this disclosure to indicate that one feature or object is in a superior position relative to an inferior feature or object, and in direct contact therewith. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Described herein is a vertically integrated composite integrated circuit (IC) device structure formed by hybrid bonding of two or more stacked IC dies. The top level metallization of the dies comprise recessed test pads. The pads are recessed below the level of the metallization stack surface so that increased surface topography caused by contact with test probes during back-end die testing is confined below the surface of the metallization stack.

FIG. 1A illustrates a cross sectional view in the x-z plane of composite die structure 100, according to some embodiments of the disclosure.

Composite IC die structure 100 comprises upper IC die 101 vertically integrated with lower IC die 102. Upper and lower IC dies 101 and 102 are bonded together at bonding interface 103. IC die 101 is shown in an inverted orientation relative to IC die 102, where substrate 104 is above device layer 105. IC die 101 comprises substrate 104, device layer 105 on substrate 104, and metallization stack 106 over device layer 105. Metallization stack 106 extends from surface 107 of substrate 104 (e.g., front side of device layer 105) to bonding interface 103. Device layer 105 comprises active devices, passive devices or a combination of active and passive devices. Active devices may include arrays of field-effect (FET) or bipolar junction transistors arranged in logic circuits, for example, to form memory, field programmable gate arrays, and other logic circuits. Transistors may also be combined with passive components to form analog circuits, such as amplifiers and the like. In some embodiments, dies 101 and 102 comprise a microprocessor and/or memory logic circuits. As an example, die 101 may be a memory chip and die 102 may be a microprocessor, where dies 101 and 102 are coupled together by bonding of the interfaced metallization stacks, as described below. Feature pitches, defined as distances between like interconnect terminals over gate, source or drain regions of individual transistors may range between 20 and 1000 nanometers (nm). For example, gate-to-gate pitches may be between 40-80 nm.

Metallization stack 106 comprises conductive layers 108, 109 and 110 embedded within interlayer dielectric (ILD) 111 at progressively increasing heights within metallization stack 106. While three conductive layers 108-110 are shown, metallization stack 106 may comprise any suitable number of conductive layers. ILD 111 may comprise multiple layers, as may be formed, for example, during a damascene build-up process of stack 106. For clarity, boundaries between adjacent ILD layers are not shown in the figure. In some embodiments, ILD 111 comprises materials such as, but are not limited to, silicon oxides (e.g., $Si_xO_{1-x}$), silicon nitrides (e.g., $Si_xN_{(1-x)}$), silicon oxynitrides (e.g., $Si_xO_yN_{(1-x-y)}$), silicon carbide (e.g., SiC) and silicon carbide nitrides (e.g., $Si_xC_yN_{1-x-y}$), aluminum oxides, and aluminum nitrides. In some embodiments, ILD layers 107 comprise low-k materials having a relative permittivity below that of $SiO_2$ (e.g., k≤3.9). ILD layer(s) 107 may comprise any of the above materials or a silicate glass, such as, but not limited to, fluorosilicate glass (FSG), phosphosilicate glass (PSG), borophosphosilicate glass (BSG) or undoped silicate glass (USG), organosilicate glass (OSG—e.g., carbon-doped oxide, CDO) porous OSG, and porous silicon dioxide. In some embodiments, one or more of ILD layers 107 may comprise low-k organic polymeric materials such as polyimides, hydrogen silsesquioxane and methyl silsesqjuioxane. The above dielectric materials may be formed by spin coating methods (e.g., spin-on glass, SOG), chemical vapor deposition (CVD) or sol gel techniques.

Layer thicknesses for both conductive layers 108, 109 and 110, as well as layers of dielectric 111 (not shown), may range from 50 nm, or less, in the lower levels proximal to substrate 104, to 5 microns, or more, in the upper levels near the top of metallization stack 106. Metallization features within the conductive layers 108-110 may include horizontal traces, for example. In the figure, metallization structures (e.g., structures 112, 113, 114 and 115) are represented as traces shown in cross-section. Inter-level vias (not shown) may extend between and vertically interconnect metallization features in conductive layers 108, 109 and 110. In some embodiments, minimum feature size and pitch may fan out (e.g., increase with increasing distance) from device layer 105.

Conductive layers 108-110 comprise metallization structures 112, 113, 114 and 115, respectively. In some embodiments, metallization structures 112-115 comprise conductive materials such as, but not limited to, copper, copper-aluminum alloy, aluminum, silver, gold, nickel, indium, and tungsten, cobalt, tungsten, tantalum, and titanium. A thin conformal barrier layer (not shown) comprising titanium, tungsten or tantalum may line the interface between ILD 111 and the bulk conductive material within the metallization structures. Lowest (e.g., proximal to device layer 105) conductive level 108 is labelled 'metal 1' (e.g., M1). Interconnect structures 112 within M1 may have the smallest CD of metallization structures within metallization stack 106, to match feature pitches of active and passive components within device layer 105. Feature pitches, defined as distances between like interconnect terminals over gate, source or drain regions of individual transistors may range between 20 and 1000 nanometers (nm). For example, gate-to-gate pitches may be between 40-80 nm.

The higher conductive layers 109 and 110 are labelled M2 and M3, respectively. Metallization structures 112 may be vertically interconnected to metallization structures 113 in M2 through interlevel vias (not shown). Although not explicitly shown in the illustrated embodiments, interlevel vias generally provide vertical interconnection of metallization features in adjacent conductive layers within a metallization stack such as stack 106. In some embodiments, metallization features (e.g., metallization structures 112-115) progressively increase in feature size (e.g., critical dimension, CD) and pitch in progressively higher conductive levels. In some embodiments, metallization features have substantially constant CD at all or most levels within stack 106.

Top-level metallization M3 includes metallization structures 114 and metallization structures 115, which in some embodiments are interspersed as shown between metallization structures 114. In some embodiments, CDs of metallization structures 115 are greater than CDs of metallization structures 114.

Lower IC die 102 is shown in an opposing orientation relative to IC die 101. Lower IC die 102 comprises substrate 118, device layer 119 in the top surface region of substrate 118, and metallization stack 120, shown over device layer 119. Metallization stack 120 extends between bond interface 103 and device layer 119. Device layer 119 comprises active devices, passive devices or a combination of active and passive devices. Metallization stack 120 comprises conductive layers 121, 122 and 123, labelled M'1, M'2 and M'3, respectively, at progressively increasing distances within ILD 124. In some embodiments, ILD 124 comprises substantially the same materials as ILD 111. Conductive layers 121, 122 and 123 extend parallel to substrate 118 within metallization stack 120, at progressively increasing distances from device layer 119. Metallization structures 125 (in M'1), 126 (in M'2), 127 and 128 (in M'3) increase in CD and pitch at progressively higher levels (e.g., increasing distance from device layer 119) within metallization stack 120. Metallization structures 127 and 128 have maximal CDs and feature pitch. In some embodiments, metallization structures 128 have a larger CD than metallization features 127.

Upper IC die 101 and lower IC die 102 are bonded to one another at bond interface 103. Top level metallization structures 127 of lower stack 120 oppose top level metallization structures 114 of upper stack 106, sharing metallic diffusion bonds at bond interface 103. Diffusion bonds may be characterized by metallic interdiffusion of metal atoms between adjacent pads. Similarly, inter-stack ILD bonds may be covalent bonds (e.g., Si—O—Si bonds) between ILDs 111 and 124 at bond interface 103.

Metallization structures 114 and 127 may be employed as bonding structures for vertical integration of upper and lower dies 101 and 102, respectively. ILD 111 may be directly bonded to ILD 124 at bond interface 103. In some embodiments, both metallic bonds and dielectric bonds may be formed by hybrid bonding, as described below. The relatively larger feature sizes and pitch of top level metallization features may mitigate reduction in metal-to-metal bonding contact area resulting from die-to-die or wafer-to-wafer lateral offsets. Such offsets may result from positioning inaccuracies. An example of lateral offset between dies 101 and 102 is indicated in the inset of FIG. 1A by the distance x.

Top-level metallization M'3 includes metallization structures 127 and metallization structures 128, which in some embodiments may be interspersed, as shown, between metallization structures 127. In some embodiments, CDs of metallization structures 128 are greater than CDs of metallization structures 127. Similarly, CDs of metallization structures 115 may be greater than CDs of metallization structures 114. Metallization structures 115 and 128 may be pads, either or both of which be employed as probe pads for electrical testing of IC dies 101 and 102, respectively. As described further below, metallization structures 115 and/or 128 may, at some point in a manufacturing process, be employed as test pads upon which probes for testing the IC die are landed. Such probing may lead to surface damage in a metallization structure. In exemplary embodiments, to mitigate detrimental effects such surface damage might otherwise have on the bond between IC dies 101 and 102, at least one of metallization structures 115 and 128 is recessed away from the plane of bonding interface 103, leaving void 116 and/or void 129 between free surface 117 of metallization structures 115 and the bonding interface 103. The amount of recess may be predetermined to accommodate any expected level of probe-induced pad topography. For example, the cumulative relief provided by void 116 and/or void 129 may exceed probe-induced topography by any suitable margin. With at least one of metallization structures 115 and 128 recessed, metallization structures 115 and 128 may not be directly bonded to each other (i.e., do not participate in the IC die bond).

In the exemplary embodiments illustrated by FIG. 1A, metallization structures 115 and metallization structures 128 are both recessed away from the plane of bonding interface 103, leaving voids 116 and 129 between free surfaces 117,130 and bond interface 103. Metallization structures 128 may oppose similarly deployed metallization structures 115 along bond interface 103, as illustrated. In some embodiments, metallization structures 128 may also be employed as test pads for landing probes for testing lower IC die 102 before vertical integration with upper IC die 101.

In some embodiments of composite IC die structure 100 comprising hybrid bonded dies, a surface roughness of less than 100 nm may facilitate direct hybrid bonding. Such minimal surface roughness may be achieved by chemical mechanical polishing (CMP) of metallization stacks 106 and 120. However, subsequent contact with test probes may damage test pads (e.g., respective metallization structures 115 and 128), deforming free surfaces 117 and 130 into a highly non-planar surface topography, that may, for example, display an average surface roughness of one to two microns. While the non-planar topography of a probed test pad might interfere with subsequent hybrid bonding of IC die 101 to 102, such damage to metallization structures 115 and 128 may be compensated, at least in part, by recessing the test pad structures relative to bonding interface 103. In the illustrated example, both the free opposing metal surfaces (e.g., free surfaces 117 and 130) of the structures are recessed back from bonding interface 103, leaving voids 116 and 129 having average z-heights 1 to 2 microns to intervene between metallization structures 115 and 128, respectively, and bond interface 103 (e.g. as described in FIG. 1B). In other embodiments, however, only one of two opposing metallization structures is recessed from a bonding interface between two IC die of a composite IC die structure. An example is shown in FIG. 1C.

Figure 1B:
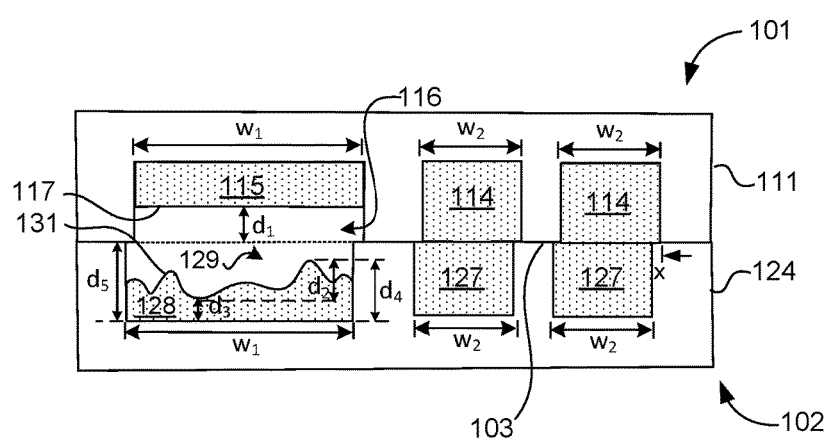
FIG. 1B illustrates a magnified cross-sectional view in the x-z plane of the portion of the composite die structure delineated by the dashed box in FIG. 1A, according to some embodiments of the disclosure.
Figure 1C:
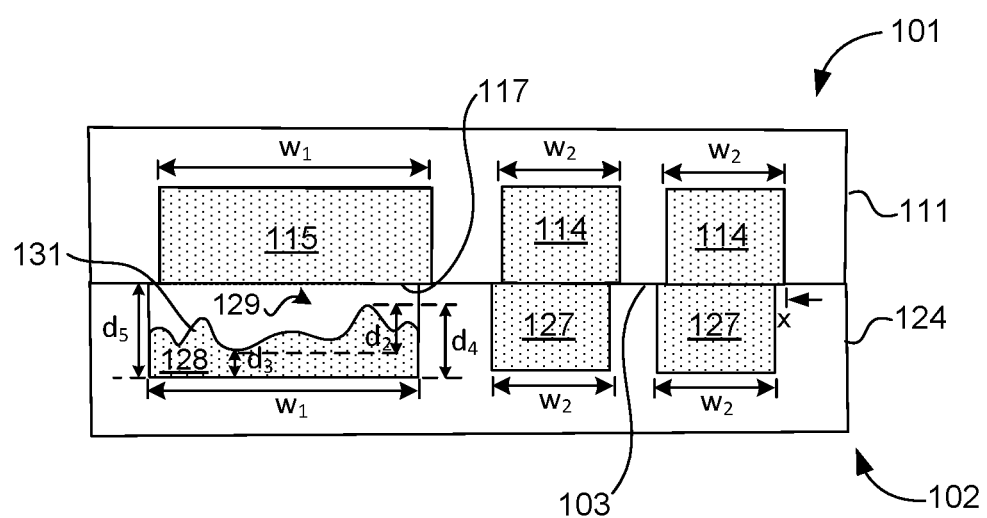
FIG. 1C illustrates a magnified cross-sectional view in the x-z plane of the portion of the composite IC die structure delineated by the dashed box in FIG. 1A, according to some embodiments of the disclosure.

FIG. 1B illustrates a magnified cross-sectional view in the x-z plane of the portion of composite IC die structure 100 delineated by the dashed box in FIG. 1A, according to some embodiments of the disclosure.

FIG. 1B illustrates structural details of recessed test pads (e.g., metallization structures 115 and 128). The region of bonded metallization stacks 106 and 120 in the vicinity of test pads comprising opposing metallization structures 115 and 128 is delineated in FIG. 1A, and shown in magnified view. In the illustrated embodiment, upper test pad (e.g., metallization structure 115) has not been damaged by contact with a test probe. Free surface 117 of the upper test pad (e.g., metallization structure 115) is recessed back from bond interface 103 by a distance d1. In some embodiments, d1 is 1 to 2 microns. Free surface 117 is shown to be substantially flat, although in some embodiments a small degree of concavity or dishing may be present. Free surface 117 may exhibit an average surface roughness that is 100 nm or less. In contrast, free surface 131 of the lower test pad (e.g., metallization structure 128) exhibits substantially greater surface roughness that may have resulted from pre-assembly probing of lower IC die 102. In some embodiments, upper test pad (e.g., metallization 115 may also exhibit similar surface damage from test probe contact. Before or after probing, metallization structure 128 may have been recessed back from bond interface 103 by substantially the same recess depth (e.g., distance d1) of metallization structure 115. Probing-induced damage may increase average surface roughness, indicated by distance d2 between free surface 131 to bond interface 103, for example, to 1 micron, or greater. Distances d3 and d4 represent minimum and maximum topography, respectively, of free surface 131, as measurable distances from bond interface 103.

In some embodiments, the CD of metallization structures 115 and 128 is greater than that of metallization structures 114 and 127. CDs of metallization structures 115 and 128, represented by feature width w1, are greater than CDs of metallization structures 114 and 127 represented by width w2 (e.g., w1>w2). Any alignment inaccuracy between metallization structures on both sides of bond interface 103 is indicated by offset x.

FIG. 1C illustrates a magnified cross-sectional view in the x-z plane of the portion of composite IC die structure 100 delineated by the dashed box in FIG. 1A, showing recess only of test pads 127, according to some embodiments of the disclosure.

FIG. 1C illustrates structural details of composite IC die structure 100 having recessed test pads only in one of the two dies. In the illustrated example, the upper test pads (e.g., metallization structures 115) in upper die 101 are not recessed. Free surface 117 of metallization is flush with bond interface 103. Lower test pads 127 in lower die 102 exhibit damage topography resulting from probe contact, as described above. During processing, lower test pads may have been recessed below bond interface 103 to a depth similar to d1 in FIG. 1B. Recess depth may have been predetermined by prior knowledge of maximal topography heights, for example, height d4, not rising above distance d5, the full depth of metallization structures 127.

Figure 2A:
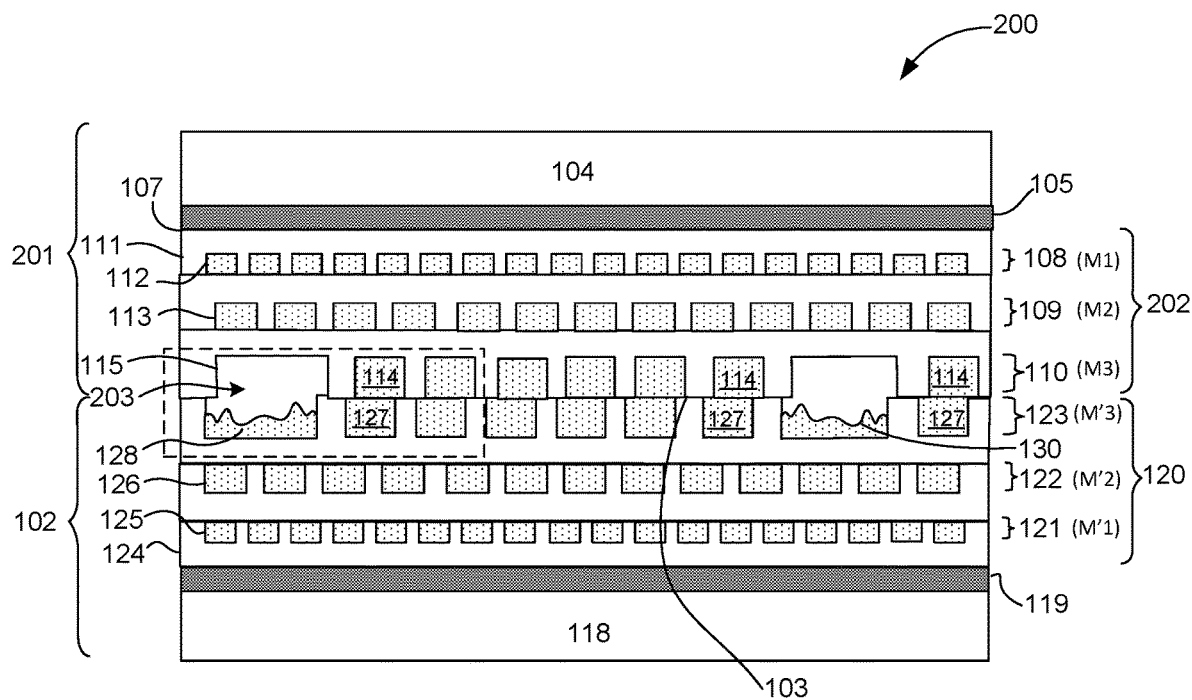
FIG. 2A illustrates a cross-sectional view in the x-z plane of an exemplary composite die structure, according to some embodiments of the disclosure.

FIG. 2A illustrates a cross-sectional view in the x-z plane of composite die structure 200, according to some embodiments of the disclosure.

Composite die structure 200 comprises upper IC die 201 vertically integrated with lower IC die 102. Upper and lower dies 201 and 102 are bonded together at bonding interface 103. Upper IC die 201 comprises substrate 104, device layer 105 and metallization stack 202. Upper IC die 201 is shown in an inverted orientation relative to IC die 102. Lower IC die 102 is substantially as shown in FIG. 1A. The structure of upper metallization stack 202 is substantially the same as upper metallization stack 106 in FIG. 1A, with the exception of the absence of test pad metallization (e.g., metallization structures 115), leaving recessed regions of dielectric 111 at bond interface 103. In the illustrated embodiment, test pads may have been recessed back substantially to ILD 111, leaving void 203 over metallization structure 128 in lower metallization stack 120.

Figure 2B:
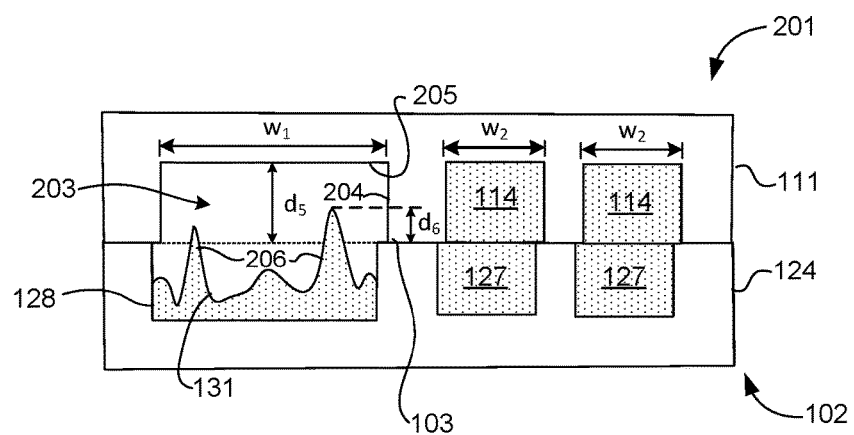
FIG. 2B illustrates a magnified cross-sectional view in the x-z plane of the portion of the composite die structure delineated by the dashed box in FIG. 2A, according to some embodiments of the disclosure.

FIG. 2B illustrates a magnified cross-sectional view in the x-z plane of the portion of composite die structure 200 delineated by the dashed box in FIG. 2A, according to some embodiments of the disclosure.

FIG. 2B illustrates structural details of the region delineated in FIG. 2A in the vicinity of the lower test pad (metallization structure 128). Void 203 may be a trench or other recessed structure in dielectric 111 of upper metallization stack 106, for example, etched in ILD 111 during damascene build-up of metallization stack 106. Void 203 may result from a complete removal of the test pad (e.g., metallization structure 115) formed previously within the recess, exposing void sidewalls 204 and bottom wall 205. Void 203 has a z-height d5 extending from bond interface 103 to void bottom wall 205. Z-height d5 may be between 2 and 5 microns.

The lower test pad example (e.g., metallization structure 128) is substantially the same as described in FIG. 1B, with the exception of exhibiting larger-scale deformation topography. Metallization structure 128 may be significantly damaged by prior interaction with a test probe. In an exemplary illustration, bumps 206, formed by deformation of free surface 131, may extend a significant distance (e.g., a large fraction of depth d5) into void 203. For example, bump 206 extends into void 203 by a distance d6 of several microns above bond interface 103, a significant portion of the recess depth d5 of void 203. Enough clearance for large-scale topography of a heavily damaged test pad may be afforded by extending depth d5 by the full z-height of the test pad (e.g., metallization structure 115). In some embodiments, d5 may be 2 to 5 microns.

Figure 3A:
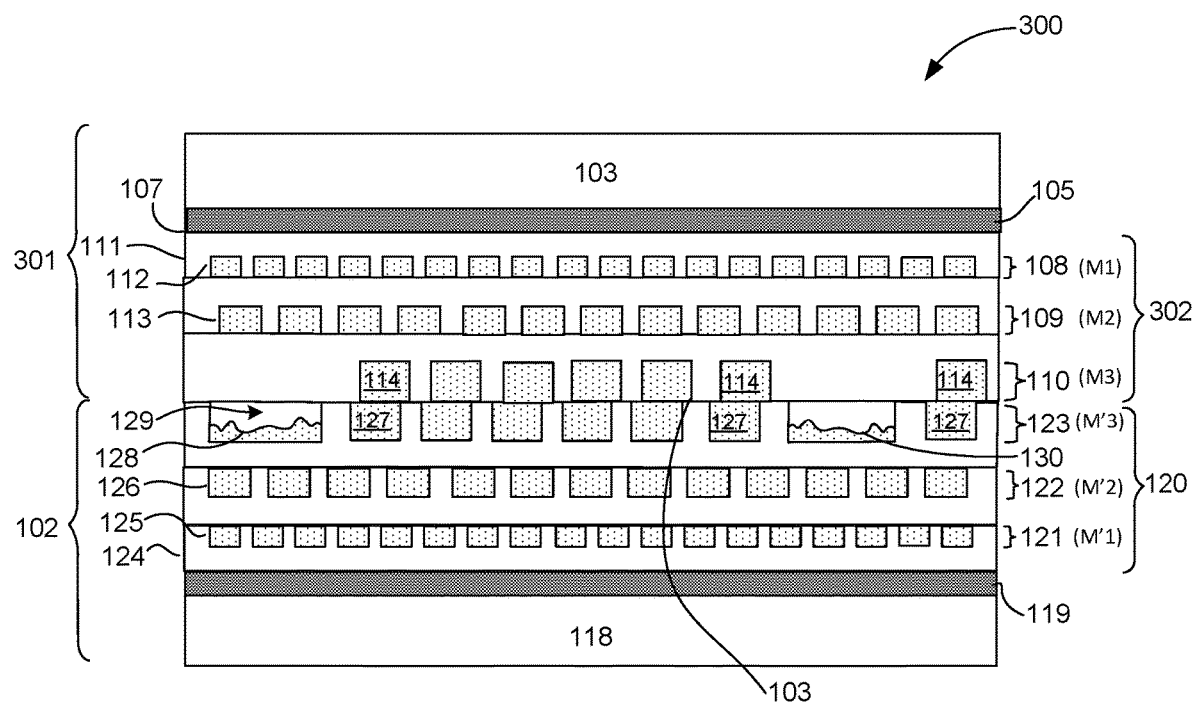
FIG. 3A illustrates a cross-sectional view in the x-z plane of a composite die structure, according to some embodiments of the disclosure.

FIG. 3A illustrates a cross-sectional view in the x-z plane of composite die structure 300, according to some embodiments of the disclosure.

Composite die structure 300 comprises upper IC die 301 vertically integrated with lower IC die 102. Upper and lower dies 301 and 102 are directly bonded together at bonding interface 103. Upper IC die 301 comprises substrate 104, device layer 105 and metallization stack 302. Although the structure of upper metallization stack 302 is substantially the same as upper metallization stacks 106 in FIG. 1A and 202 in FIG. 2A, in some embodiments, conductive layer 110 comprises only upper bonding pads (e.g., metallization structures 114). In some embodiments, at least some of the upper test pads (e.g., metallization structures 115, see FIGS. 2A and 2B) are omitted at locations along bond interface 103 where lower test pads (e.g., metallization structures 128) are present. In the illustrated embodiment, level M3 of metallization stack 106 comprises metallization structures 114. In metallization stack 302, ILD 111 replaces test pads (e.g., metallization structures 115, see FIG. 1A) at the locations along bonding interface 103 described embodiments shown in FIGS. 1A and 2A.

Figure 3B:
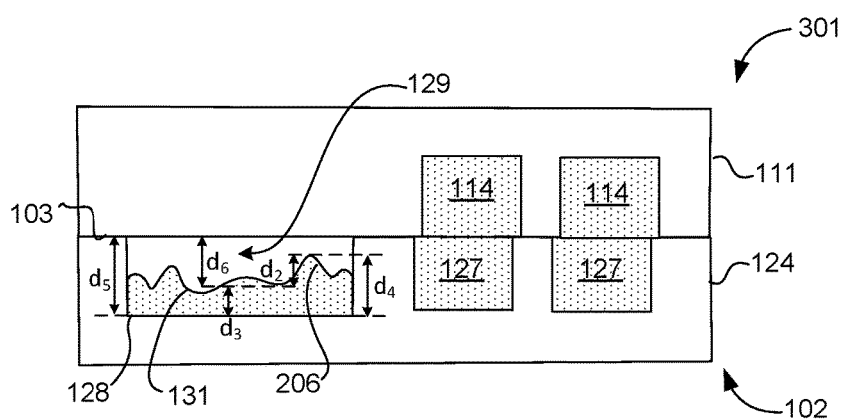
FIG. 3B illustrates a magnified cross-sectional view in the x-z plane of the portion of a composite die structure delineated by the dashed box in FIG. 3A, according to some embodiments of the disclosure.

FIG. 3B illustrates a magnified cross-sectional view in the x-z plane of the portion of composite die structure 300 delineated by the dashed box in FIG. 3A, according to some embodiments of the disclosure.

FIG. 3B illustrates structural details of the region delineated in FIG. 3A in the vicinity of the lower test pad (metallization structure 128). Damage topography of metallization structure 128 may not surpass maximal z-height d4, and entirely confined within void 129 below bond interface 103. Z-height d2 of bump 206 may be 0.1 to 1 microns above average recess depth d6 of metallization structure 128.

Void 129 is sealed above bond interface 103 by dielectric 111. Average recess depth d6 below bond interface 103 of metallization structure 128 may be 1 to 3 microns. Feature depth d5 may be adjusted to allow for a target feature z-height d3 of the test pad (e.g., metallization structure 128) and any predetermined level of topography that may be induced through a potential electrical test probing.

Figure 4:
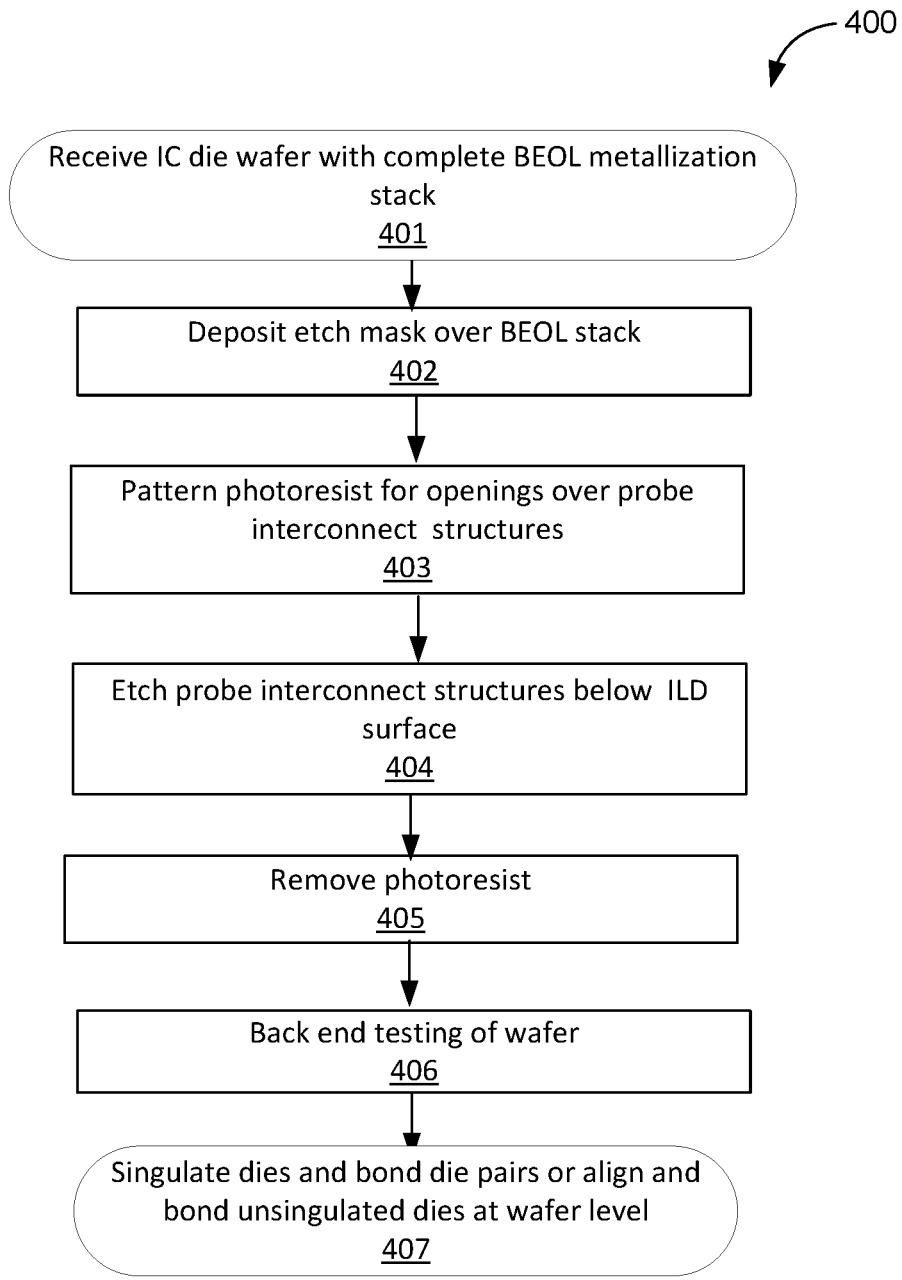
FIG. 4 illustrates a process flow chart summarizing an exemplary method for making composite die structure, according to some embodiments of the disclosure.

FIG. 4 illustrates process flow chart 400 summarizing an exemplary method for making composite die structure 100, where test pads are recessed by a wet chemical etch, according to some embodiments of the disclosure.

At operation 401, one or more die wafers are received from a back-end-of-line (BEOL) metallization stack (e.g., metallization stack 102) build-up process, where BEOL metallization is completed. The wafers may comprise multiple dies having common BEOL metallization. BEOL metallization top level interconnects comprise test pads (e.g., metallization structures 115, 128) and bonding pads (e.g., metallization structures 114, 127). CDs of test pads may be larger than CDs of bonding pads.

At operation 402, the BEOL stack is prepared for a through-mask metal etch to recess selected test pads below the top surface of the ILD. In some embodiments, an etch mask comprising a photoresist is deposited over the top of the BEOL stack on the wafer. The photoresist may be deposited by spin or spray coating. The photoresist layer may have a thickness of 1 to 5 microns. A positive or negative tone photoresist mask may be employed as the etch mask.

At operation 403, the photoresist etch mask is patterned to form openings over the test pads. After through-mask exposure of the photoresist in a mask aligner, the photoresist layer is treated in a developer bath to form openings over selected test pads. A bake step may follow to harden the photoresist layer.

At operation 404, the wafer is subjected to any metal etch process suitable for the metal composition. In some examples, a wet chemical bath may be employed to etch back selected test pads. An etch bath, for example, comprising potassium iodide and iodine, or ferric chloride, for dissolving copper, or other suitable oxidizing etch chemistry for copper and/or other metals, may be employed. Test pads may be recessed back by 2 to 3 microns.

At operation 405, the photoresist mask is removed. The wafer may be further processed by deionized water rinse and dry. At operation 406, the wafer is electrically tested. Recessed test pads may be contacted by tester probes, where the probe contact may damage the test pads, for example as described above.

At operation 407, the wafer may be singulated to liberate dies after testing. IC dies with poor electrical testing performance may be rejected. Functional dies from the same wafer may be vertically integrated, for example where they are stacked and directly bonded together. Bonding pads and test pads from opposing die pairs may be interfaced, for example by a pick and place tool. A small degree of alignment error may occur due to tool inaccuracy, resulting in a degree of centering offset (e.g., offset x) between opposing pads that may be significantly larger than misregistration between two adjacent levels of damascene metallization, for example as shown in FIG. 1B. Alternatively, a second wafer that has undergone similar processing is introduced for vertical integration of dies from the second wafer on dies of the first wafer.

Dies on opposing wafers may be interfaced at wafer level by wafer-to-wafer alignment. The second wafer is interfaced to the first wafer such that the bonding pads (e.g., metallization structures 114/127) and test pads (metallization structures 115/128) are interfaced. Some alignment offset between opposing structures may be present. Stacked singulated or unsingulated dies may be hybrid bonded by clamping together and/or thermally treating the stacked dies.

FIGS. 5A-5G illustrate a series of cross-sectional views in the x-z plane of an exemplary method for making composite die structure 100, according to some embodiments of the disclosure.

Figure 5A:
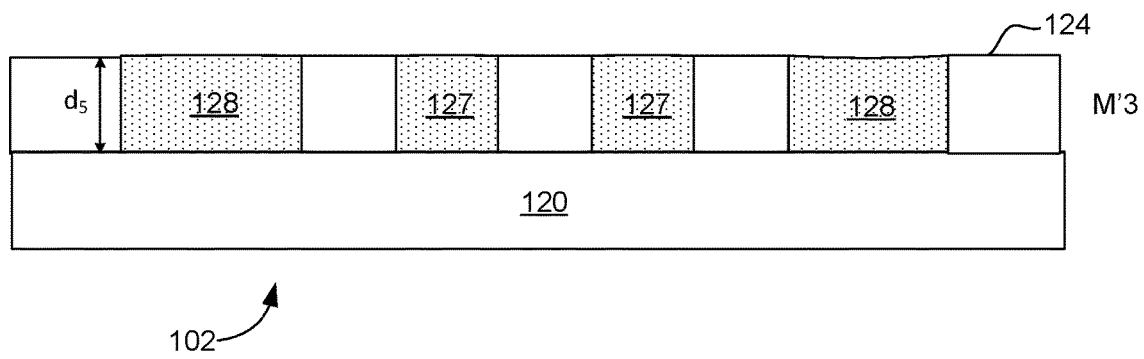
FIGS. 5A-5G illustrate a series of cross-sectional views in the x-z plane of an exemplary method for making a composite die structure, according to some embodiments of the disclosure.

In FIG. 5A, a wafer comprising multiple unsingulated dies 102 (or 101) is received after back-end-of-the-line (BEOL) processing. A single IC die 102 is shown to represent the wafer carrying the unsingulated dies. In some embodiments, the wafer may carry a single type of die, following design rules shown for IC die 102 in FIG. 1. In some embodiments, the wafer may comprise two or more subsets of dies. Individual die subsets may follow specific design rules unique to that die subset. For example, a wafer may carry a die subset exemplified by upper IC die 201 shown in FIG. 2A, and/or a subset exemplified by upper IC die 301, shown in FIG. 3A.

In alternative embodiments, multiple wafers may be received, where individual wafers carry single sets of identical dies, for example, dies 101, 201 or 301. Metallization stack 120 is built up to top-level metallization, for example, metallization level M3, comprising metallization features 128 (e.g., test pads) and 127 (e.g., bonding pads). Test pads and bonding pads are separated by ILD 124. Metallization features 128 may have a larger width than metallization features 127, for example of up to 100 microns and 20 microns, respectively.

The larger CD of test pads (e.g., metallization structures 128) to accommodate contact with a relatively large diameter test probe tip. Bonding pads (metallization features 127) may, for example, have widths (or diameters) of up to 5 microns.

In some embodiments, metallization stack 120 may have undergone a planarization process by, for example, chemical mechanical polishing (CMP). The planarization operation may reduce surface roughness of the top surface of metallization stack 120 comprising ILD 124 and metallization structures 127 and 128, in preparation for hybrid bonding. For example, surface roughness of top level metallization stack structures, including metallization structures 127 and 128, may be 100 nm or less.

Figure 5B:
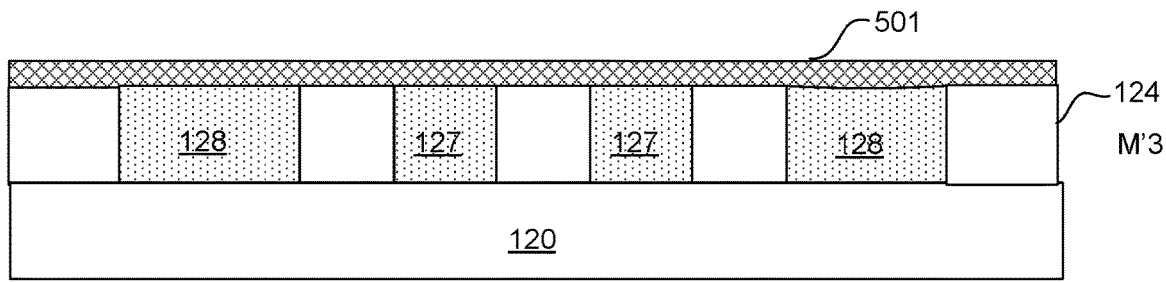

In FIG. 5B, the wafer is prepared for a through-mask wet metal etch to recess test pads (e.g., metallization structures 128). A photoresist layer 501 is deposited over the top of BEOL stack 120, covering metallization structures 127 and 128 and ILD 124. In some embodiments, the etch mask is a photoresist layer. The photoresist layer may be deposited by spin coating or spray coating, forming a layer of photoresist of up to 5 microns, for example. To withstand an oxidative and/or acidic etch bath, a polymeric photoresist comprising, for example, Novolak, acrylic or epoxy (e.g., SU8) resins may be employed. The photoresist material may be positive tone or negative tone resist materials. Thermal cross-linking of photoresist layer 501 may be necessary to stabilize the photoresist mask against chemical attack in a highly acidic/oxidizing environment.

Figure 5C:
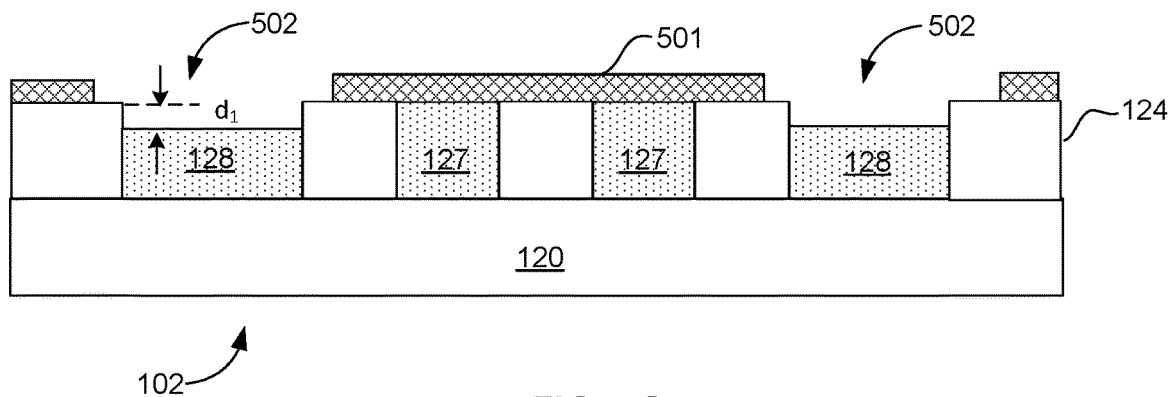

In FIG. 5C, the photoresist layer 501 is patterned to reveal metallization structures 128 (e.g., test pads). Openings 502 are formed over metallization structures 128 by through-mask light exposure (for example, in a mask alignment tool), and subsequent treatment in an appropriate developer bath. Development of features (e.g., openings 502) in photoresist layer 501 may be followed by a hard bake to harden the photoresist by further thermal cross-linking.

IC die 102 is subsequently treated in an etch bath at wafer level to recess exposed test pads (e.g., metallization features 128). Test pads may comprise metals such as, but not limited to, copper, gold, silver, nickel or aluminum. The etch bath may comprise oxidizing acids, iodine and iodide couples, ferric chloride, acidic hydrogen peroxide, etc., capable of attacking the above-noted metals. Etching may be conducted at room temperature. Metallization structures 128 may be partially recessed back a distance d1 below the surface of ILD 124, where d1 may be 1 to 3 microns. The electrochemical etch of the test pad may further smooth or slightly increase the surface roughness of the test pad relative to the CMP surface finish.

Subsequent to the etch process, the photoresist mask is removed in a suitable stripping bath. IC die 102 may be further cleaned in one or more DI water rinse/dry cycles.

Figure 5D:
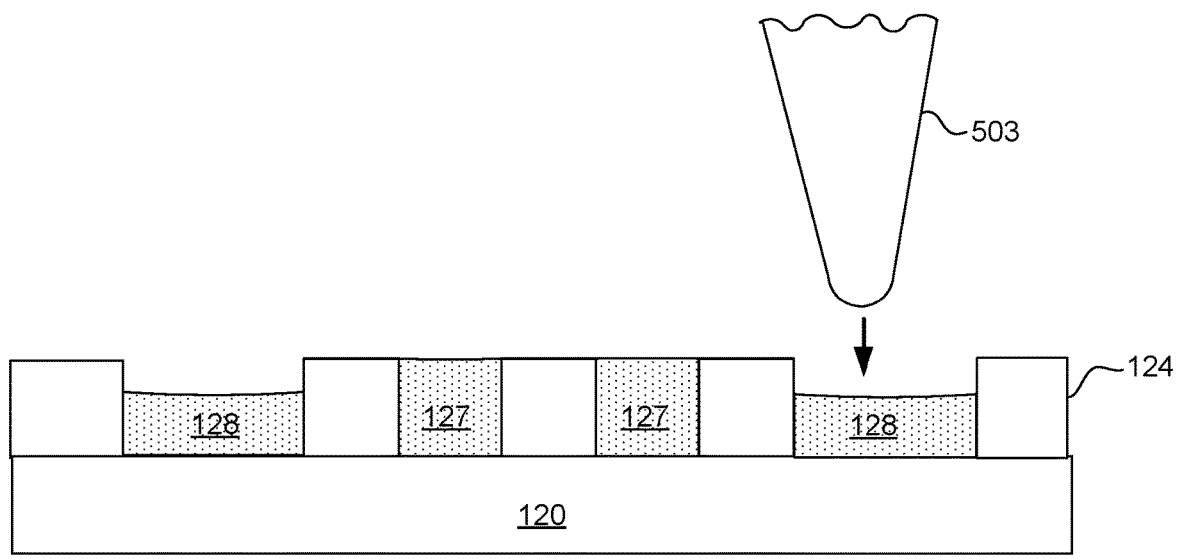

In FIG. 5D, IC die 102 is prepared for back-end testing. IC die 102 may be tested for functionality at wafer level or first singulated as individual dies, then probed at die level. IC die 102 may be placed on a probing tool, where a probe tip or card having multiple probe tips is lowered onto IC die 102. As illustrated in FIG. 5D, probe tip 503 is lowered, as indicated by the downward pointing arrow, over a recessed test pad (metallization structure 128). Metallization structures 128 may have a CD (e.g., diameter) to accommodate the radius of probe tip 503.

Figure 5E:
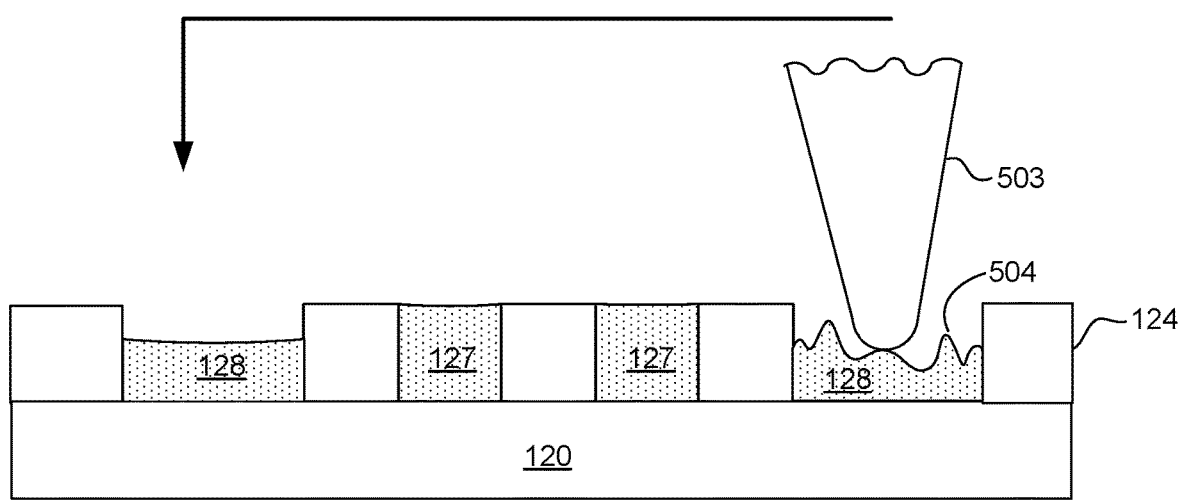

In FIG. 5E, probe tip 503 is shown to be in contact with a test pad (metallization structure 128), causing damage to the test pad by mechanical disruption of the surface finish of the test pad. The pre-contact surface finish may have very small topography, having a surface roughness of 100 nm (measured in surface height variations) or less. Damage may be in the form of increased surface topography, where surface roughness may be increased to 1 to 2 microns, indicated by the formation of large-scale surface roughness bumps 504. Z-heights are not indicated in the figure, and details of relative z-heights are referred to FIG. 1B. Probe 503 is moved between multiple test pads, as indicated.

Figure 5F:
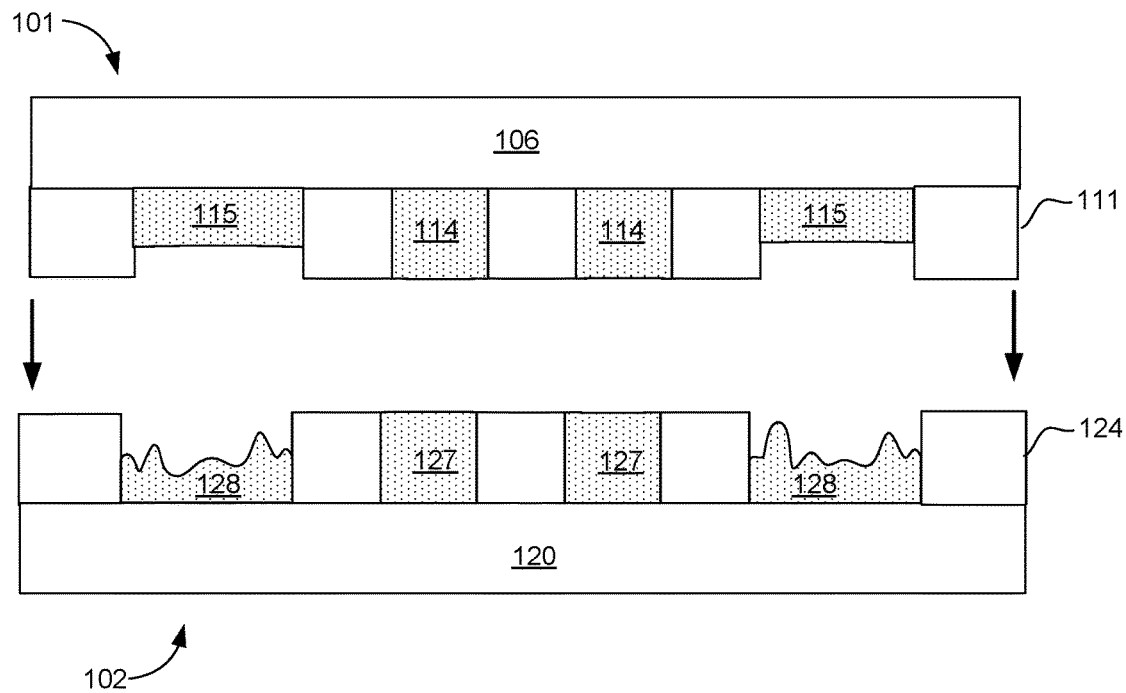

In FIG. 5F, IC die 102 is prepared for vertical integration with a second IC die 101. IC die 101 may be identical to IC die 102. In some embodiments, IC die 101 may differ from IC die 102. Dies 101 and 102 are mated, where metallization structures 127 on IC die 102 are interfaced and contacted to metallization structures 114 on IC die 101. Recessed metallization structures 128 in IC die 102 are opposed to recessed metallization structures 115 on IC die 101, but not in direct contact with each other. Although, IC die 101 test pads (e.g., metallization structures 115) do not exhibit surface damage as large-scale surface roughness in the illustrated embodiment as do IC die 102 test pads (metallization structures 128), metallization structures 115 may exhibit similar large scale surface roughness. The arrows in the figure indicate that opposing dies 101 and 102 are aligned and contacted. In some embodiments, dies 101 and 102 are interfaced at wafer level using lithographic alignment (e.g., in a pattern alignment tool). In some embodiments, singulated dies 101 and 102 are interfaced using a pick-and-place tool.

Figure 5G:
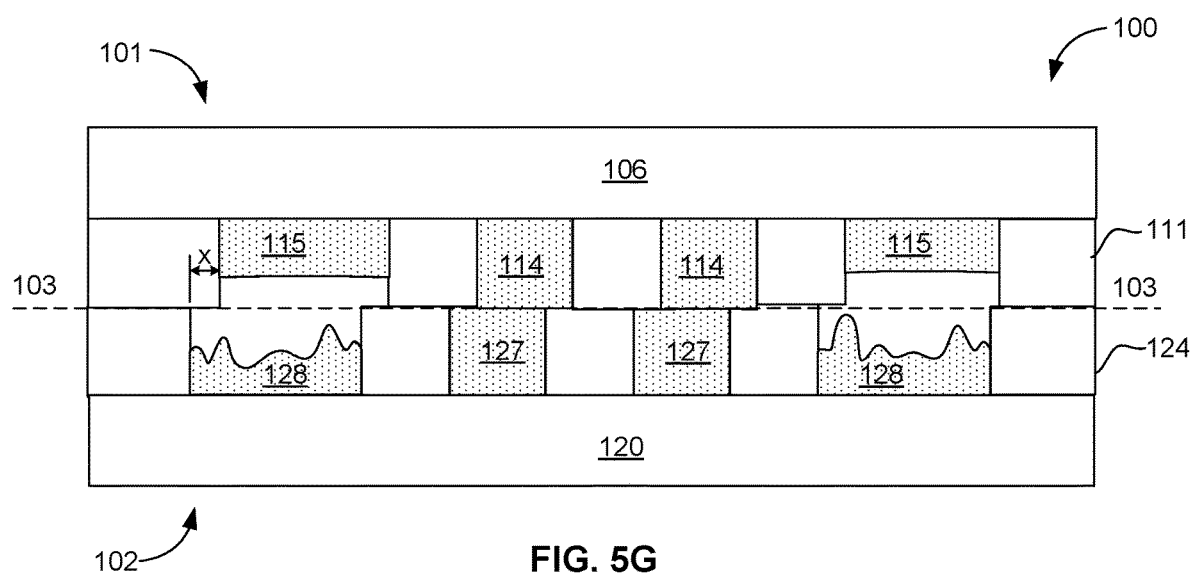

In FIG. 5G, mated dies 101 and 102 are bonded to form composite die structure 100. In some embodiments, dies 101 and 102 are bonded by hybrid bonding. Hybrid bonding is a direct bonding of mated materials, where need for intermediate bonding materials such as solder and adhesives is obviated. Metal-to-metal bonds are formed across bond interface 103 between mated metal structures. Covalent bonds are formed between mated dielectric materials across the same bond interface 103. Hybrid bonding may enable bonding of metallization structures having CD under 5 microns, including CDs under 1 micron. Errors in alignment of metallization structures 114 and 127 may be observable about the bond interface 103, as shown in the figure by offset x.

Figure 6:
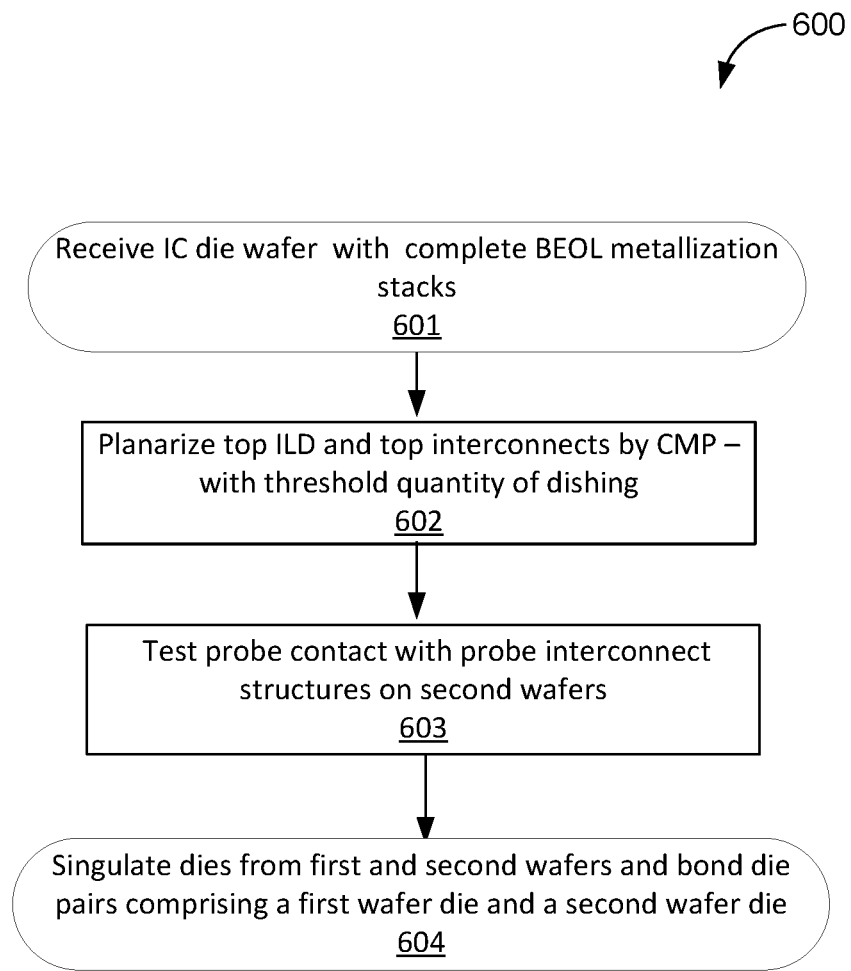
FIG. 6 illustrates a process flow chart summarizing an alternative exemplary method for making a composite die structure, according to some embodiments of the disclosure.

FIG. 6 illustrates process flow chart 600 summarizing an alternative exemplary method for making composite die structure 100, where test pads are recessed by CMP, according to some embodiments of the disclosure.

At operation 601, one or more die wafers are received from a back-end-of-line (BEOL) metallization stack (e.g., metallization stack 102) build-up process, where BEOL metallization is completed. The wafers may comprise multiple dies having common BEOL metallization. BEOL metallization top level interconnects comprise test pads (e.g., metallization structures 115, 128) and bonding pads (e.g., metallization structures 114, 127). CDs of test pads may be larger than CDs of bonding pads.

At operation 602, the BEOL stack is subject to chemical mechanical planarization (CMP) to recess test pads (e.g., metallization structures 115 or 128). CMP may cause dishing of exposed metallization structures, where the surfaces of the metallization structures are eroded by mechanical abrasion, causing recessing away from the ILD surface. A degree of concavity may be introduced to the recessed surface, referred to as dishing. Larger structures often display greater dishing than smaller structures. Test pads may have a significant size differential with bonding pads (e.g., metallization structures 114) so that CMP-induced dishing of top-level interconnects may be sufficient to selectively recess pads that may be electrically probed (and thus become damaged) to such an extent that a further probe pad mask and pad recess etch is not needed.

At operation 603, the wafers are placed in a test jig for back-end testing. Recessed test pads may be contacted by probes, where the probe contact may damage the test pads as described above.

At operation 604, the processed wafers may be singulated to liberate the good dies after testing. Dies may be singulated before testing. Defective dies may be rejected. Functional dies from the same wafer may be vertically integrated, where functional dies are stacked together by a pick and place operation. Bonding pads and test pads from opposing die pairs are interfaced by a pick and place tool. A small degree of alignment error may occur due to tool inaccuracy, resulting in a degree of centering offset (e.g., offset x) between opposing pads, as shown in FIG. 1B. Alternatively, a second wafer that has undergone similar processing is introduced for vertical integration of dies from the second wafer on dies of the first wafer.

Dies on opposing wafers may be interfaced at wafer level by wafer-to-wafer alignment. The second wafer is interfaced to the first wafer such that the bonding pads (e.g., metallization structures 114/127) and test pads (metallization structures 115/128) are interfaced. Some alignment offset between opposing structures may be present. Stacked singulated or unsingulated dies may be hybrid bonded by subjecting the stacked dies to thermal treatment.

FIGS. 7A-7D illustrate a series of cross-sectional views in the x-z plane of an exemplary method for making composite die structure 100, according to some embodiments of the disclosure.

Figure 7A:
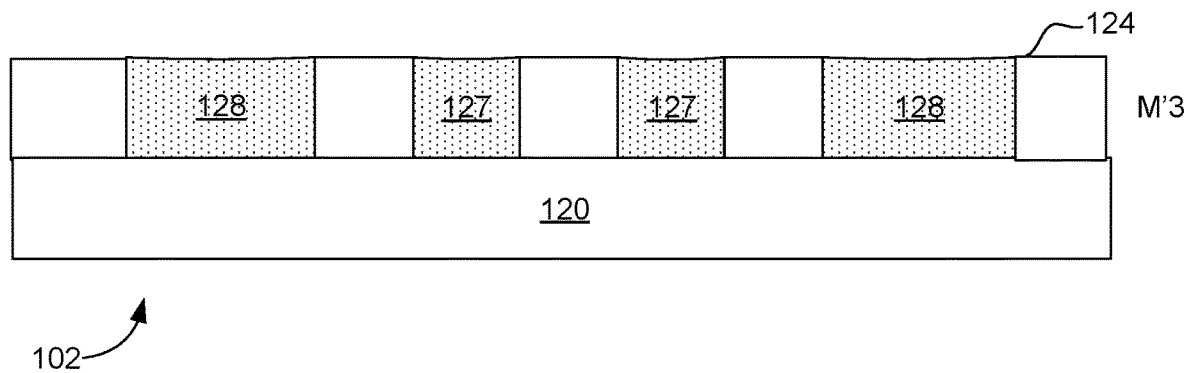
FIGS. 7A-7D illustrate a series of cross-sectional views in the x-z plane of an exemplary method for making a composite die structure, according to some embodiments of the disclosure.

In FIG. 7A, a wafer comprising multiple unsingulated dies 102 is received after back-end-of-the-line (BEOL) processing. A single IC die 102 (or 101) is shown to represent the wafer carrying the unsingulated dies. In some embodiments, the wafer may carry a single type of die, following design rules shown for IC die 102 in FIG. 1. In some embodiments, the wafer may comprise two or more subsets of dies. Individual die subsets may follow specific design rules unique to that die subset. For example, a wafer may carry a die subset exemplified by upper IC die 201 shown in FIG. 2A, and/or a subset exemplified by upper IC die 301, shown in FIG. 3A.

In alternative embodiments, multiple wafers may be received, where individual wafers carry single sets of identical dies, for example, dies 101, 201 or 301. Metallization stack 106 is built up to top-level metallization, for example, metallization level M3, comprising metallization features 128 (e.g., test pads) and 127 (e.g., bonding pads). Test pads and bonding pads are separated by ILD 124. Metallization features 128 may have a larger width (e.g., up to 100 microns) than metallization features 127 of up to 20 microns to accommodate contact with a relatively large diameter test probe tip. Bonding pads (metallization features 127) may have widths (or diameters) of up to 5 microns.

In some embodiments, metallization stack 120 may have undergone a planarization process by, for example, chemical mechanical polishing (CMP). The planarization operation may reduce surface roughness of the top surface of metallization stack 106, comprising ILD 124 and metallization structures 127 and 128, in preparation for hybrid bonding. For example, surface roughness of top level metallization stack structures, including metallization structures 127 and 128, may be less than 100 nm.

Figure 7B:
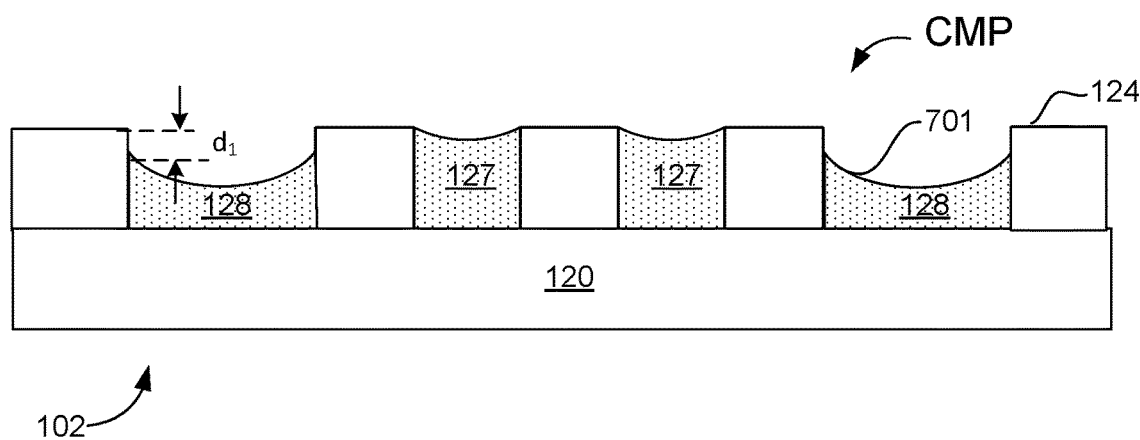

In FIG. 7B, IC die 102 is subject to a CMP planarization operation to recess test pads (metallization structures 128). CMP-induced recessing (e.g., dishing) of metal interconnect features increases as feature CD increases. Design rules may require a significantly larger CD for test pads (e.g., metallization structures 128) than for bond pads (e.g., metallization structures 127) to enhance CMP-induced recessing of metallization structures 128. Free surface 701 of dished metallization structures 128 may exhibit a degree of concavity, as shown in the figure. The amount of recess may be characterized by setback d1, which may depend on any combination of the type of chemical agent used for chemical polishing, the abrasive medium, and length of time of the CMP processing.

Figure 7C:
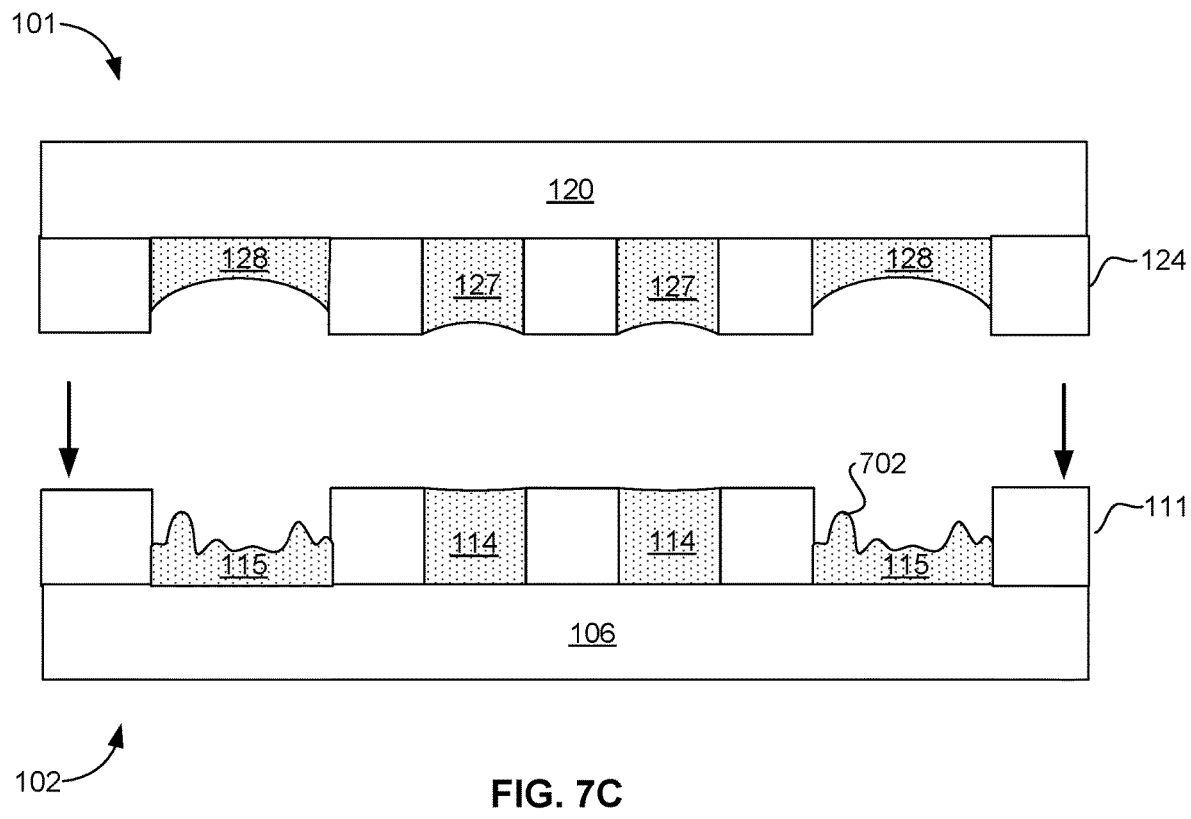

In FIG. 7C, IC die 102 has been subjected to back-end testing probing as shown in FIGS. 5D and 5E, having caused large-scale topology bumps 702 of metallization structures 115. IC die 102, is prepared for vertical integration with IC die 101. As noted above, IC die 101 may be identical to IC die 102, or may be substantially different from IC die 102. Dies 101 and 102 may be singulated. IC die 101 may be mated to IC die 102 by a pick-and-place tool, which may align metallization structures 114 and 115 to metallization structures 127 and 128 before contacting IC die 101 to IC die 102.

Alternatively, dies 101 and 102 may be aligned and mated at wafer level after back-end testing. A lithographic tool, for example, a mask aligner, may be employed to align unsingulated dies 101 and 102.

Figure 7D:
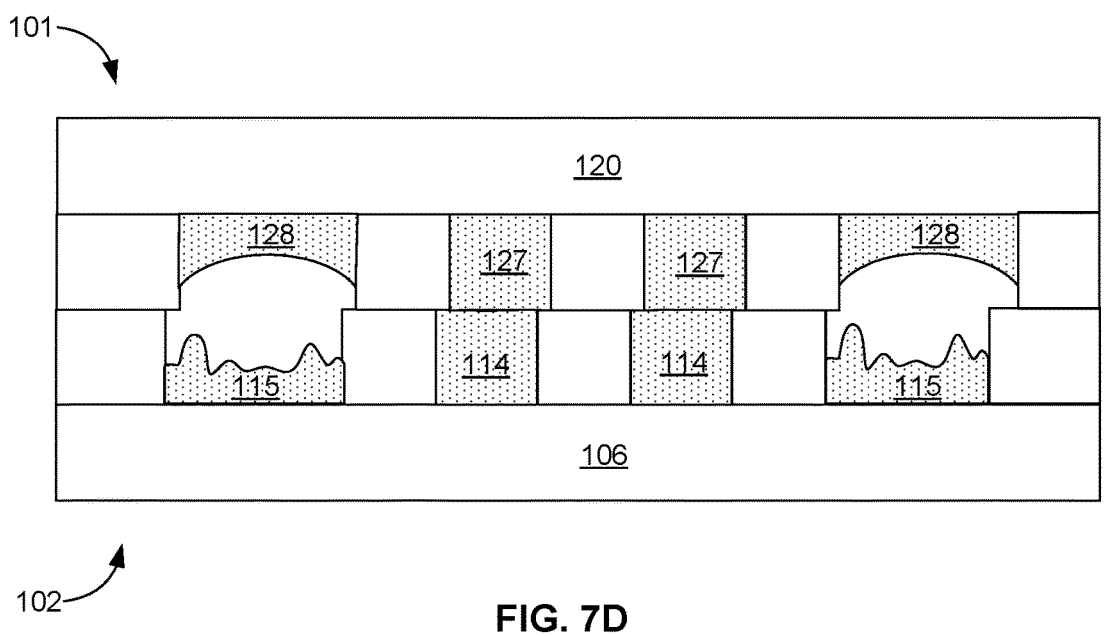

In FIG. 7D, mated dies 101 and 102 are bonded to form composite die structure 100. In some embodiments, dies 101 and 102 are bonded by hybrid bonding.

Figure 8:
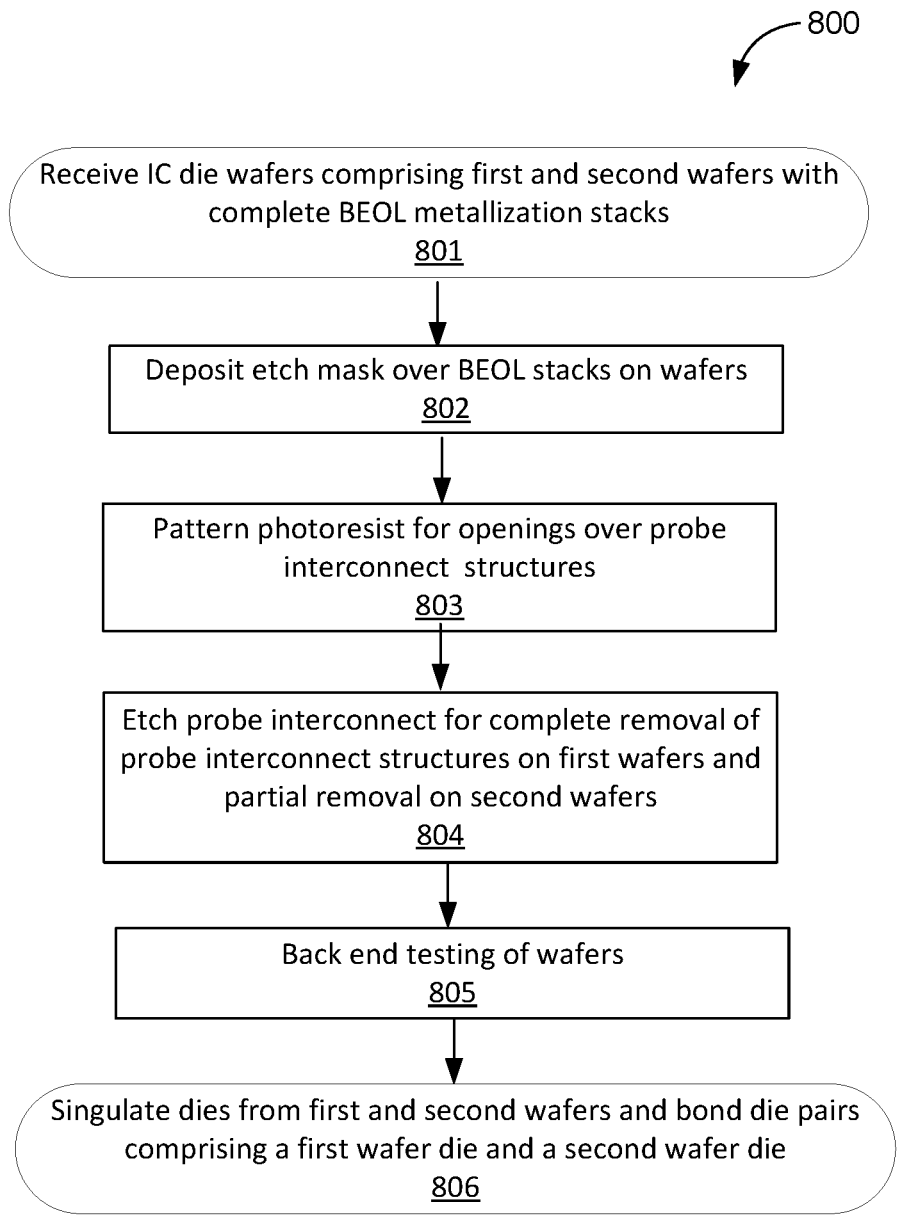
FIG. 8 illustrates a process flow chart summarizing an exemplary method for making composite die structure shown in FIG. 2, according to some embodiments of the disclosure.

FIG. 8 illustrates process flow chart 800 summarizing an exemplary method for making composite die structure 200, according to some embodiments of the disclosure.

At operation 801, first and second die wafers are received from a back-end-of-line (BEOL) metallization stack buildup process, where BEOL metallization is completed. The first and second wafers may each comprise multiple dies (e.g., dies 201 and/or 102). In some embodiments, the first and second wafers may be identical wafers. First and second wafers are distinguished from each other for separate downstream processing.

At operation 802, the BEOL stacks of both first and second wafers are prepared for a through-mask metal etch to recess selected test pads below the top surface of the ILD. In some embodiments, an etch mask comprising a photoresist is deposited over the top of the BEOL stack on the wafer. The photoresist may be deposited by spin or spray coating. The photoresist layer may have a thickness of 200 nm. A positive or negative tone photoresist mask may be employed as the etch mask.

At operation 803, the photoresist etch mask is patterned to form openings over the test pads. After through-mask exposure of the photoresist in a photolithographic exposure tool, the photoresist layer is treated in a developer bath to form openings over selected test pads. A bake step may follow to harden the photoresist layer.

At operation 804, the first and second wafers are subject to a separate metal wet etches to attack selected test pads to differing degrees. As described above, a copper etch bath, for example, a bath comprising potassium iodide and iodine for dissolving copper, or other suitable oxidizing etch chemistry for copper and/or other metals, may be employed. Test pads on the first wafer may be completely removed to expose underlying ILD, for example, to produce dies 201. Test pads on the second wafer may be partially etched back as described in the process flow in FIG. 4, for example, to produce dies 101.

At operation 805, the photoresist mask is removed by dissolution in a remover bath. The wafer may be further processed by deionized water rinse and dry. Dies 201 and 102 on first and second wafers may be tested for functionality by test probe contact with selected test pads on the second wafer, as shown in FIG. 4.

At operation 806, the wafer may be singulated to liberate dies after testing. Defective dies are rejected. Functional dies from the first and second wafers may be vertically integrated with each other, where functional dies from the first wafer (e.g., dies 201) are stacked over dies from the second wafer (e.g., dies 101) by a pick and place operation. Bonding pads and test pads from opposing die pairs are interfaced by a pick and place tool. A small degree of alignment error may occur due to tool inaccuracy, resulting in a degree of centering offset (e.g., offset x) between opposing pads, as shown in FIG. 2B. Following alignment, mated dies may be hybrid bonded. Offset x may not be constant over the length over die 101 or the length of the wafer.

Alternatively, dies 201 and 101 on first and second wafers, respectively, may be interfaced at wafer level by wafer-to-wafer alignment. The second wafer is interfaced to the first wafer such that the bonding pads (e.g., metallization structures 114/127) are interfaced. Due to some recessing, bonding pads may not touch initially. Some alignment offset between opposing structures may be present. Wafer-level hybrid bonding may follow alignment.

FIGS. 9A-9E illustrate a series of cross-sectional views in the x-z plane of an exemplary method for making composite die structure 200, according to some embodiments of the disclosure.

Figure 9A:
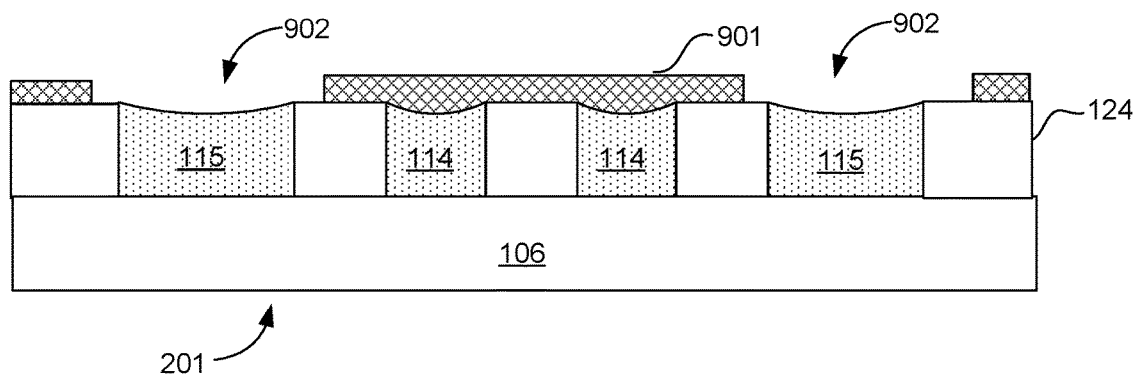
FIGS. 9A-9E illustrate a series of cross-sectional views in the x-z plane of an exemplary method for making a composite die structure, according to some embodiments of the disclosure.

In FIG. 9A, IC die 201 from a first wafer is prepared for a through-mask wet metal etch to deeply recess test pads (e.g., metallization structures 128), or completely remove them. A photoresist layer 901 is deposited over the top of BEOL stack 120, covering metallization structures 127 and 128 and ILD 124. In some embodiments, the etch mask is a photoresist layer. Photoresist layer 901 is patterned to reveal metallization structures 128 (e.g., test pads). Openings 902 are formed over metallization structures 128.

Figure 9B:
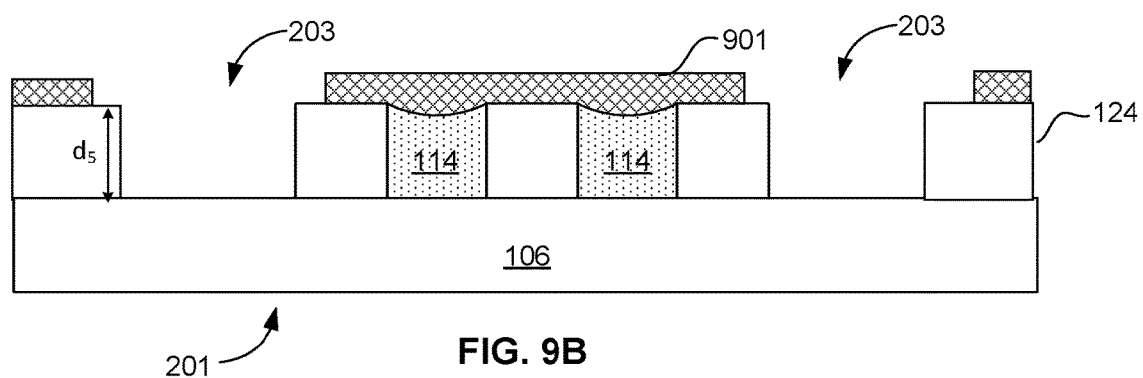

In FIG. 9B, IC die 201 is subsequently treated in an etch bath at wafer level to recess exposed test pads (e.g., metallization features 128). Metallization structures 128 may be completely etched to underlying ILD 124, leaving void 203. Alternatively, metallization structures 128 may be etched to a very small thickness relative to depth d5 of void 203, where d5 may up to 5 microns. The electrochemical etch of the test pad may further smooth or slightly increase the surface roughness of the test pad relative to the CMP surface finish.

Figure 9C:
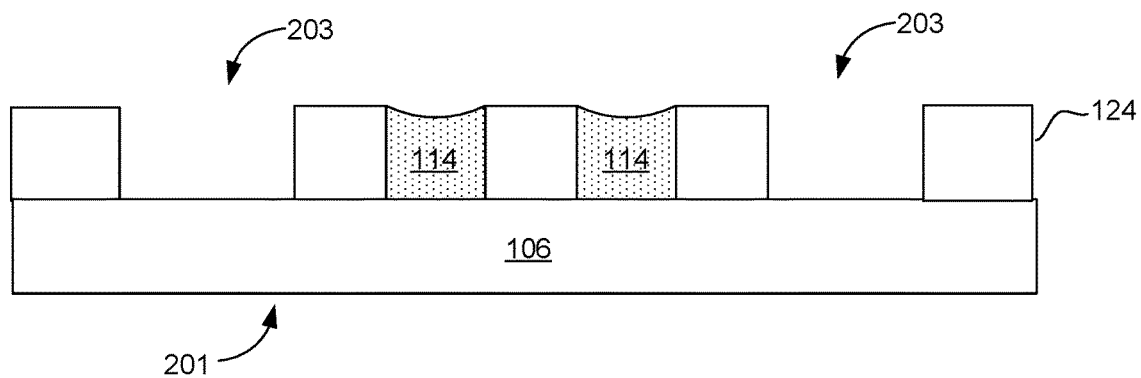

Subsequent to the etch process, the photoresist layer 902 is removed in a suitable stripping bath, as shown in FIG. 9C. IC die 201 may be further cleaned in one or more DI water rinse/dry cycles.

Figure 9D:
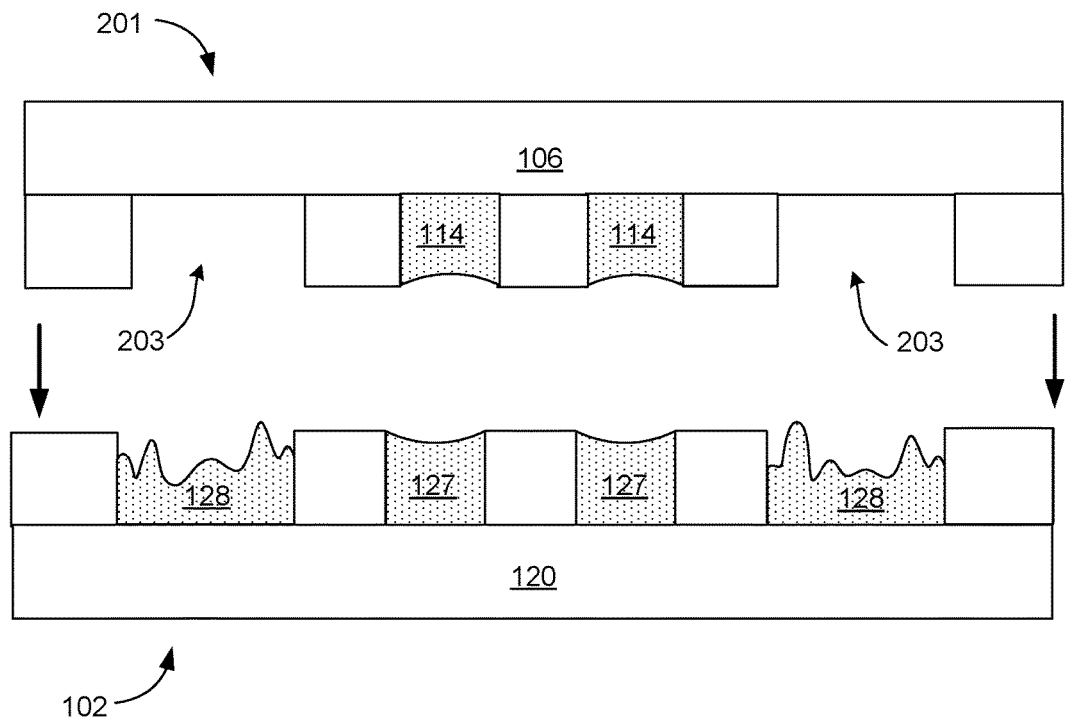
Figure 9E:
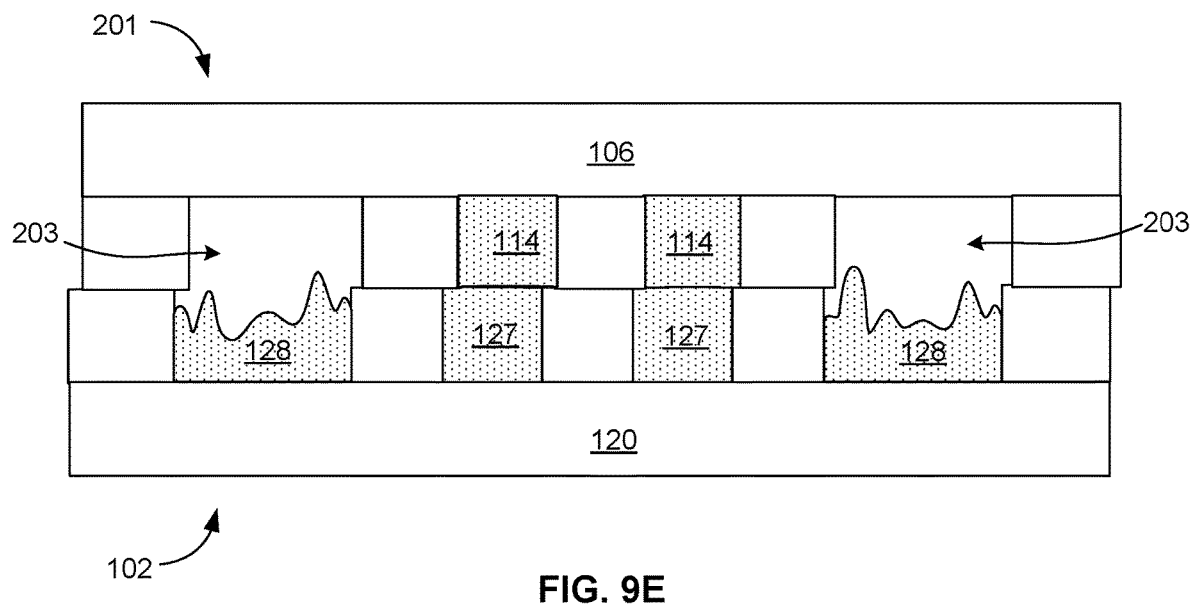

In FIGS. 9D and 9E, IC die 201 is mated to IC die 102 from a second wafer. IC die 102 may be fabricated in the process illustrated in FIGS. 5A-5G. Metallization structures 128 on IC die 102 are shown with large scale topography due to probe damage (illustrated in FIG. 2B). Damaged metallization structures 128 are opposed to voids 203.

Figure 10:
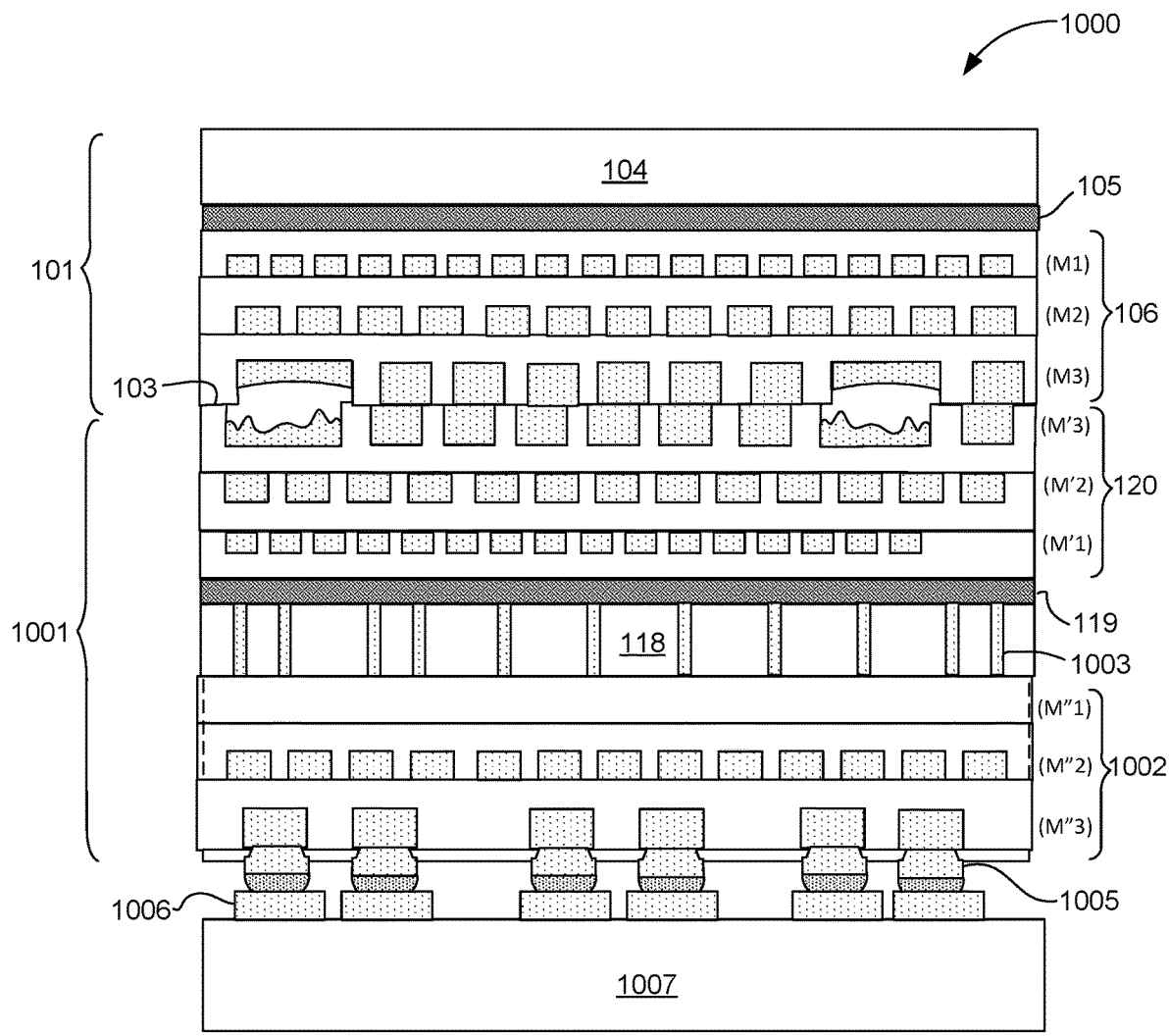
FIG. 10 illustrates a cross-sectional view in the x-z plane of a composite die structure bonded to an external substrate, according to some embodiments of the disclosure.

FIG. 10 illustrates a cross-sectional view in the x-z plane of composite die structure 1000 bonded to external substrate 1007, according to some embodiments of the disclosure.

Composite die structure 1000 comprises upper IC die 101 sharing bond interface 103 with lower IC die 1001. Lower IC die 1001 comprises metallization stack 120 on frontside of substrate 118, having direct interconnection to device layer 119. Metallization stack 1002 is on the backside of substrate 118.

Through-silicon vias (TSVs) 1003 extend through substrate 118 to interconnect transistors in device layer 119 to inner-most metallization structures (e.g., at level M"1) within metallization stack 1002. Interconnect structures 1005 are joined to pads 1006 on external substrate 1007 by solder joints. In some embodiments, external substrate 1007 is a package substrate. In some embodiments, external substrate 1007 is an interposer substrate. In some embodiments, external substrate 1007 is a printed circuit board.

External substrate 1007 may comprise power routing and signal routing coupled to device layer 119 through inter-level vias (not shown) in metallization stack 1002. Power and data signals may be routed to device layer 105 of upper IC die 101 though vertical interconnects (e.g., interlayer vias, not shown) in bonded metallization stacks 120 and 106.

Figure 11:
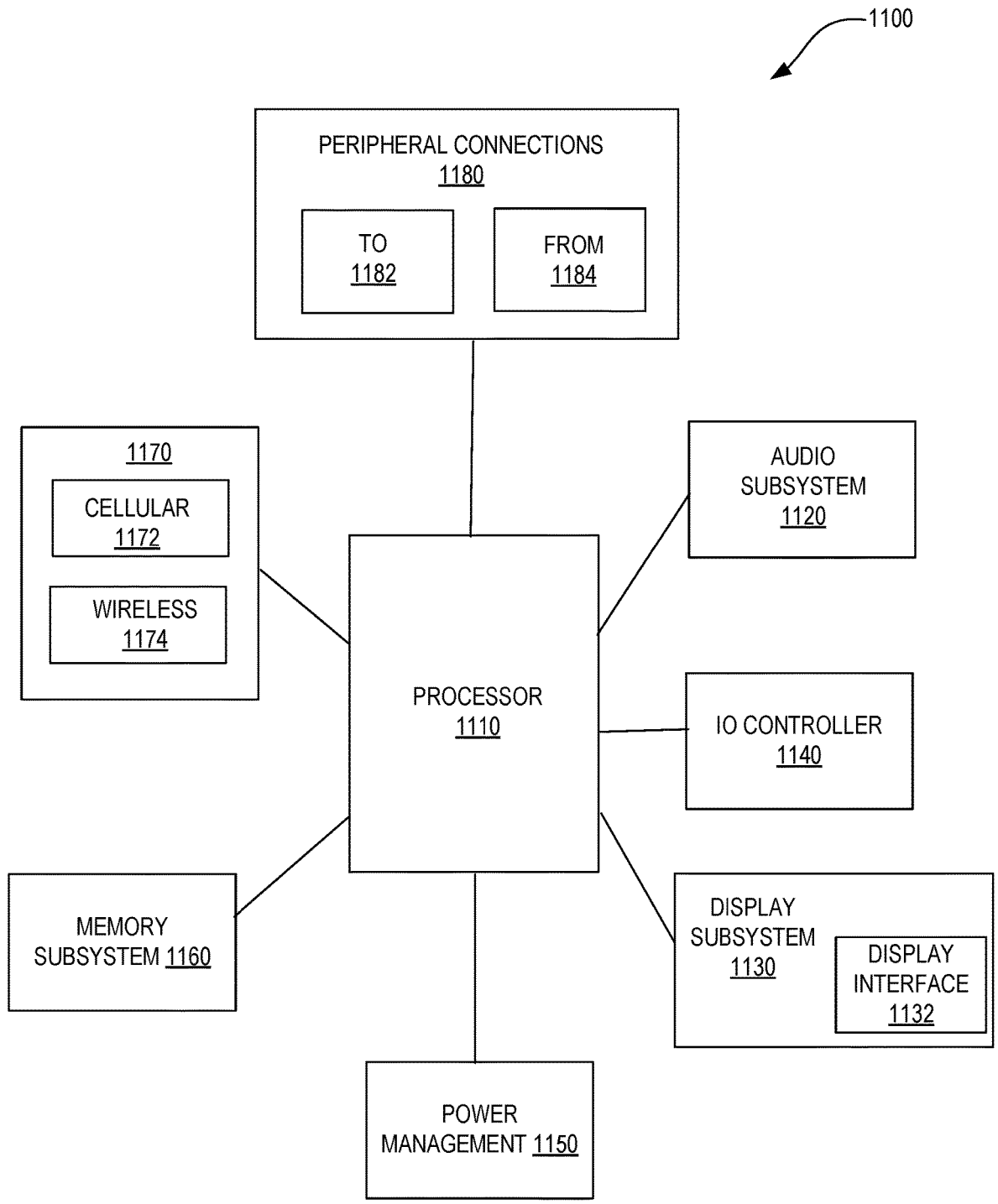
FIG. 11 illustrates a block diagram of a computing device as part of a system-on-chip (SoC) package comprising a composite die structure in an implementation of a computing device, according to some embodiments of the disclosure.

FIG. 11 illustrates a block diagram of computing device 1100 as part of a system-on-chip (SoC) package comprising a composite die (e.g., any of composite die structure 100, 200, 300 or 1000 disclosed herein) in an implementation of a computing device, according to some embodiments of the disclosure.

According to some embodiments, computing device 1100 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., representing a central processing unit. In some embodiments, the IC package comprises a composite die structure (e.g., any of composite die structures 100, 200, 300 or 1000), according to the embodiments of the disclosure.

In some embodiments, computing device has wireless connectivity (e.g., Bluetooth, WiFi and 5G network). It will be understood that certain components are shown generally, and not all components of such a device are shown in computing device 1100.

The various embodiments of the present disclosure may also comprise a network interface within 970 such as a wireless interface so that a system embodiment may be incorporated into a wireless device, for example, cell phone or personal digital assistant. The wireless interface includes a millimeter wave generator and antenna array.

According to some embodiments, processor 1110 represents a CPU or a GPU, and can include one or more physical devices, such as microprocessors, application processors, microcontrollers, programmable logic devices, or other processing means. The processing operations performed by processor 1110 include the execution of an operating platform or operating system on which applications and/or device functions are executed. The processing operations include operations related to I/O (input/output) with a human user or with other devices, operations related to power management, and/or operations related to connecting the computing device 1100 to another device. The processing operations may also include operations related to audio I/O and/or display I/O.

In one embodiment, computing device 1100 includes audio subsystem 1120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1100, or connected to the computing device 1100. In one embodiment, a user interacts with the computing device 1100 by providing audio commands that are received and processed by processor 1110

Display subsystem 1130 represents hardware (e.g., display devices) and software (e.g., drivers) components that provide a visual and/or tactile display for a user to interact with the computing device 1100. Display subsystem 1130 includes display interface 1132 which includes the particular screen or hardware device used to provide a display to a user. In one embodiment, display interface 1132 includes logic separate from processor 1110 to perform at least some processing related to the display. In one embodiment, display subsystem 1130 includes a touch screen (or touch pad) device that provides both output and input to a user.

I/O controller 1140 represents hardware devices and software components related to interaction with a user. I/O controller 1140 is operable to manage hardware that is part of audio subsystem 1120 and/or display subsystem 1130. Additionally, I/O controller 1140 illustrates a connection point for additional devices that connect to computing device 1100 through which a user might interact with the system. For example, devices that can be attached to the computing device 1100 might include microphone devices, speaker or stereo systems, video systems or other display devices, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of the computing device 1100. Additionally, audio output can be provided instead of, or in addition to display output. In another example, if display subsystem 1130 includes a touch screen, the display device also acts as an input device, which can be at least partially managed by I/O controller 1140. There can also be additional buttons or switches on the computing device 1100 to provide I/O functions managed by I/O controller 1140.

In one embodiment, I/O controller 1140 manages devices such as accelerometers, cameras, light sensors or other environmental sensors, or other hardware that can be included in the computing device 1100. The input can be part of direct user interaction, as well as providing environmental input to the system to influence its operations (such as filtering for noise, adjusting displays for brightness detection, applying a flash for a camera, or other features).

In one embodiment, computing device 1100 includes power management 1150 that manages battery power usage, charging of the battery, and features related to power saving operation. Memory subsystem 1160 includes memory devices for storing information in computing device 1100. Memory can include nonvolatile (state does not change if power to the memory device is interrupted) and/or volatile (state is indeterminate if power to the memory device is interrupted) memory devices. Memory subsystem 1160 can store application data, user data, music, photos, documents, or other data, as well as system data (whether long-term or temporary) related to the execution of the applications and functions of the computing device 1100.

Elements of embodiments are also provided as a machine-readable medium (e.g., memory 1160) for storing the computer-executable instructions. The machine-readable medium (e.g., memory 1160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1170 includes hardware devices (e.g., wireless and/or wired connectors and communication hardware) and software components (e.g., drivers, protocol stacks) to enable the computing device 1100 to communicate with external devices. The computing device 1100 could be separate devices, such as other computing devices, wireless access points or base stations, as well as peripherals such as headsets, printers, or other devices.

Network interface 1170 can include multiple different types of connectivity. To generalize, the computing device 1100 is illustrated with cellular connectivity 1172 and wireless connectivity 1174. Cellular connectivity 1172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1180 include hardware interfaces and connectors, as well as software components (e.g., drivers, protocol stacks) to make peripheral connections. It will be understood that the computing device 1100 could both be a peripheral device ("to" 1182) to other computing devices, as well as have peripheral devices ("from" 1184) connected to it. The computing device 1100 commonly has a "docking" connector to connect to other computing devices for purposes such as managing (e.g., downloading and/or uploading, changing, synchronizing) content on computing device 1100. Additionally, a docking connector can allow computing device 1100 to connect to certain peripherals that allow the computing device 1100 to control content output, for example, to audiovisual or other systems.

In addition to a proprietary docking connector or other proprietary connection hardware, the computing device 1100 can make peripheral connections 1180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an Integrated Circuit (IC) device, comprising a first component comprising a first dielectric and a plurality of adjacent first interconnect structures within the first dielectric; and a second component comprising a second dielectric and a plurality of adjacent second interconnect structures within the second dielectric, wherein a first of the second interconnect structures is in direct contact with a first of the first interconnect structures at a bond interface between the first and second components, and wherein a second of the first interconnect structures is set back a distance from a plane of the bond interface.

Example 2 includes all of the features of example 1, wherein the second of the first interconnect structures is set back from an opposing surface of either the second dielectric or a second of the second interconnect structures.

Example 3 includes all of the features of example 2, wherein a void is between a free surface of the second of the first interconnect features and an opposing free surface of either the second dielectric or the second of the second interconnect structures.

Example 4 includes all of the features of example 3, wherein the free surface of the second of the first interconnect features has a z-height variation of at least 1 um.

Example 5 includes all of the features of any one of examples 2 through 4, wherein the second of the first interconnect structures is set back from an opposing surface the second of the second interconnect structures, and wherein the second of the first interconnect structures is set back a second distance from the plane of the bond interface.

Example 6 includes all of the features of example 5, wherein a surface of the second of the first interconnect structures is dished away from the plane of the bond interface.

Example 7 includes all of the features of example 6, wherein a surface of a second of the second interconnect structures is also dished away from the plane of the bond interface.

Example 8 includes all of the features of any one of examples 1 through 7, wherein the distance is at least 2 um.

Example 9 includes all of the features of any one of examples 1 through 8, wherein the first of the first interconnect structure has a first lateral width and the second of the first interconnect structure has a second lateral width that is greater than the first lateral width.

Example 10 includes all of the features of example 10, wherein the difference between the first width and the second width is at least 5 microns.

Example 11 includes all of the features of any one of examples 1 through 10, wherein the first dielectric is between sidewalls of the first interconnect structures.

Example 12 includes all of the features of example 11, wherein the distance between the first sidewall and the second sidewall is at least 500 nanometers.

Example 13 is a system, comprising a microprocessor; and a memory coupled to the microprocessor, wherein at least one of the memory or the microprocessor comprises a first IC die comprising a first dielectric and a plurality of adjacent first interconnect structures; and a second IC die comprising a second dielectric and a plurality of adjacent second interconnect structures, wherein a first of the second interconnect structures is in direct contact with a first of the first interconnect structures at a bond interface between the first and second components, and wherein a second of the first interconnect structures is set back a distance from a plane of the bond interface.

Example 14 includes all of the features of example 13, wherein the microprocessor comprises the first IC die and wherein the memory comprises the second IC die.

Example 15 includes all of the features of examples 13 or 14, wherein the at least one of the first or second IC die is coupled to a printed circuit board.

Example 16 is a method for making an IC device, comprising forming a plurality of adjacent first interconnect structures within a first dielectric of a first component; recessing a first of the first interconnect structures below a surface of the first dielectric that is planar with a second of the first interconnect structures; and bonding the first component to a second component wherein the second component comprises a plurality of second interconnect structures within a second dielectric, and wherein a bond interface is formed between the second of the first interconnect structures and a first of the second interconnect structures, and wherein the first of the first interconnect structures is set back from the plane of the bond interface.

Example 17 includes all of the features of example 16, wherein recessing the second ones of the first interconnect structures below the surface of the first dielectric comprises polishing the surface of the first dielectric, wherein the plurality of first interconnect structures is polished to be substantially planar with the surface of the first dielectric, forming an etch mask over the surface of the first dielectric, wherein an aperture is over the second ones of the first interconnect structures; and etching back the second ones of the first interconnect structures so that a free surface of the second ones of the first interconnect structures is below the surface of the first dielectric.

Example 18 includes all of the features of examples 16 or 17, wherein forming a plurality of first interconnect structures in a surface of a first dielectric of a first component comprises forming the first ones of the plurality of first interconnect structures having a first width and the second ones of the plurality of first interconnect structures having a second width that is greater than the first width.

Example 19 includes all of the features of example 18, wherein recessing the second ones of the first interconnect structures below the surface of the first dielectric comprises polishing the first ones and the second ones of the plurality of first interconnect structures so that a free surface of the first ones is a first distance below the surface of the first dielectric, and a free surface of the second ones of the plurality of first interconnect structures is a second distance greater than the first distance below the surface of the first dielectric.

Example 20 includes all of the features of any one of examples 16 through 19, further comprising recessing second ones of the plurality of second interconnect structures below a surface of the second dielectric on the second component, wherein the second ones of the plurality of second interconnect structures are completely removed by etching to a distance that is a z-height of the second ones of the second interconnect structures.

An abstract is submitted with the understanding that it will not be used to limit the scope or meaning of the claims. The following claims are hereby incorporated into the detailed description, with each claim standing on its own as a separate embodiment.

We claim:

1. An Integrated Circuit (IC) device, comprising:
   a first component comprising a first dielectric and a plurality of adjacent first interconnect structures within the first dielectric; and
   a second component comprising a second dielectric and a plurality of adjacent second interconnect structures within the second dielectric, wherein a first of the second interconnect structures is in direct contact with a first of the first interconnect structures at a bond interface between the first and second components,
   wherein a second of the first interconnect structures is set back a distance from a plane of the bond interface, and wherein a void is between a free surface of the second of the first interconnect structures and an opposing free surface of either the second dielectric or the second of the second interconnect structures.

2. The IC device of claim 1, wherein the free surface of the second of the first interconnect structures has more surface topography than opposing surface of either the second dielectric or a second of the second interconnect structures.

3. The IC device of claim 2, wherein the free surface of the second of the first interconnect structures has a z-height variation of at least 1um.

4. The IC device of claim 1, wherein the second of the first interconnect structures is set back a first distance from an opposing surface the second of the second interconnect structures, and wherein the second of the first interconnect structures is set back from the plane of the bond interface by a second distance, greater than the first distance.

5. The IC device of claim 4, wherein a surface of the second of the first interconnect structures is dished away from the plane of the bond interface.

6. The IC device of claim 5, wherein a surface of a second of the second interconnect structures is also dished away from the plane of the bond interface.

7. The IC device of claim 1, wherein the distance is at least 2 um.

8. The IC device of claim 1, wherein the first of the first interconnect structures has a first lateral width and the second of the first interconnect structures has a second lateral width that is greater than the first lateral width.

9. The IC device of claim 8, wherein the difference between the first lateral width and the second lateral width is at least 5 microns.

10. The IC device of claim 1, wherein the first dielectric is between sidewalls of the first interconnect structures.

11. The IC device of claim 10, wherein the distance between the first sidewall and the second sidewall is at least 500 nanometers.

12. A system, comprising:
a microprocessor; and
a memory coupled to the microprocessor, wherein at least one of the memory or the microprocessor comprises: a first integrated circuit (IC) die comprising a first dielectric and a plurality of adjacent first interconnect structures; and
a second IC die comprising a second dielectric and a plurality of adjacent second interconnect structures, wherein a first of the second interconnect structures is in direct contact with a first of the first interconnect structures at a bond interface between the first and second IC die, and wherein a second of the first interconnect structures is set back a distance from a plane of the bond interface, and wherein a void is between a free surface of the second of the first interconnect structures and an opposing free surface of either the second dielectric or the second of the second interconnect structures.

13. The system of claim 12, wherein the microprocessor comprises the first IC die and wherein the memory comprises the second IC die.

14. The system of claim 12, wherein the at least one of the first or second IC die is coupled to a printed circuit board.

15. A method for making an IC device, comprising:
forming a plurality of adjacent first interconnect structures within a first dielectric of a first component;
recessing a first of the first interconnect structures below a surface of the first dielectric that is planar with a second of the first interconnect structures; and
bonding the first component to a second component wherein the second component comprises a plurality of second interconnect structures within a second dielectric, and wherein a bond interface is formed between the second of the first interconnect structures and a first of the second interconnect structures, and wherein the first of the first interconnect structures is set back from the plane of the bond interface, and wherein a void is between a free surface of the first of the first interconnect structures and an opposing free surface of either the second dielectric or a second of the second interconnect structures.

16. The method of claim 15, wherein recessing the first of the first interconnect structures below the surface of the first dielectric comprises:
polishing the surface of the first dielectric, wherein the plurality of first interconnect structures is polished to be substantially planar with the surface of the first dielectric;
forming an etch mask over the surface of the first dielectric, wherein an aperture is over the first of the first interconnect structures; and
etching back the first of the first interconnect structures so that a free surface of the first of the first interconnect structures is below the surface of the first dielectric.

17. The method of claim 15, wherein forming a plurality of first interconnect structures in a surface of a first dielectric of a first component comprises forming the second of the first interconnect structures having a first width and the first of the plurality of first interconnect structures having a second width that is greater than the first width.

\* \* \* \* \*